US012586636B2

(12) United States Patent
Kim et al.

(10) Patent No.: US 12,586,636 B2
(45) Date of Patent: Mar. 24, 2026

(54) ANALOG-DIGITAL HYBRID COMPUTING METHOD AND NEUROMORPHIC SYSTEM USING THE SAME

(71) Applicant: Intelligent HW, Inc., Lewes, DE (US)

(72) Inventors: Jun-sung Kim, Seongnam-si (KR);
Sang-hoon Yoon, Seongnam-si (KR)

(73) Assignee: IHW INC., Yongin-si (KR)

( * ) Notice: Subject to any disclaimer, the term of this patent is extended or adjusted under 35 U.S.C. 154(b) by 750 days.

(21) Appl. No.: 17/989,964

(22) Filed: Nov. 18, 2022

(65) Prior Publication Data

US 2023/0162787 A1      May 25, 2023

(30) Foreign Application Priority Data

Nov. 24, 2021      (KR) ......................... 10-2021-0163223

(51) Int. Cl.
| | |
|---|---|
| *G06F 30/30* | (2020.01) |
| *G11C 7/10* | (2006.01) |
| *G11C 7/16* | (2006.01) |
| *G11C 11/54* | (2006.01) |

(52) U.S. Cl.
CPC ............ G11C 11/54 (2013.01); G11C 7/1063 (2013.01); G11C 7/109 (2013.01); G11C 7/16 (2013.01)

(58) Field of Classification Search
CPC ....... G11C 11/54; G11C 7/1063; G11C 7/109; G11C 7/16; G11C 13/004; G11C 13/0069;
(Continued)

(56) References Cited

U.S. PATENT DOCUMENTS 11,132,598 B1 * 9/2021 Nadji-Tehrani ........ G06N 3/049
2016/0359108 A1 * 12/2016 Majhi .................. H10N 70/066
(Continued)

OTHER PUBLICATIONS

Yao, Peng, et al. "Fully hardware-implemented memristor convolutional neural network." Nature 577.7792 (Jan. 29, 2020): 641-661.
(Continued)

*Primary Examiner* — Jack Chiang
*Assistant Examiner* — Brandon Bowers
(74) *Attorney, Agent, or Firm* — LEX IP MEISTER, PLLC

(57) ABSTRACT

A neuromorphic system according to an embodiment of the invention includes an input signal section that generates an input signal, a synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an output signal for each output electrode line by the input signal, a digital calculation section that digitizes the output signal generated for each output electrode line and calculates a sum of the digitized output signals, and a controller section that controls the input signal section, the synapse section, and the digital calculation section, and the controller section designates the number of digitized digits for each output electrode line and stores the logic state in the plurality of non-volatile memory cells according to a predetermined weight in each of the plurality of synaptic units, causes the input signal generated by the input signal section to be applied to each of a plurality of non-volatile memory cells of each of the plurality of synaptic units through the input electrode lines, generates, as the output signal, a sum of currents flowing
(Continued)

Matrix calculation

$$[1 \quad 3 \quad 6] \times \begin{bmatrix} 2 \\ 5 \\ 1 \end{bmatrix} = 23$$

Input
$X_1$ 1
$X_2$ 3
$X_3$ 6

$X_1$
$X_2$
$X_3$ $2^3 \quad 2^2 \quad 2^1 \quad 2^0$ $L_3 \quad L_2 \quad L_1 \quad L_0$ $W_{11}$
$W_{21}$
$W_{31}$ $W_{11}$ 2 → (0010)
$W_{21}$ 5 → (0101)
$W_{31}$ 1 → (0001)

: ON-CELL
: OFF-CELL

| | $L_3$ | $L_2$ | $L_1$ | $L_0$ | Total |
|---|---|---|---|---|---|
| $X_1$ | 0 | 0 | $\chi^*C_{13} = 1^*i$ | 0 | |
| $X_2$ | 0 | $3\chi^*C_{22} = 3^*i$ | 0 | $3\chi^*C_{24} = 3^*i$ | |
| $X_3$ | 0 | 0 | 0 | $6\chi^*C_{34} = 6^*i$ | |
| OUTPUT SIGNAL | 0 | $3^*i$ | $1^*i$ | $9^*i$ | |
| DIGITAL SIGNAL | 0 | $3^*2^2$ | $1^*2^1$ | $9^*2^0$ | 23 | from the plurality of non-volatile memory cells of each of the plurality of synaptic units by the applied input signal for each output electrode line, and causes the digital calculation section to digitize the output signal generated for each output electrode line according to the number of digits and calculate the sum of the digitized output signals.

20 Claims, 17 Drawing Sheets

(58) Field of Classification Search
     CPC .... G11C 13/0002; G06N 3/065; G06N 3/049;
                    G06N 3/063; G06N 3/061; G06J 1/00
     See application file for complete search history.

(56) References Cited

U.S. PATENT DOCUMENTS

| | | | |
|---|---|---|---|
| 2020/0356848 A1* | 11/2020 | Lesso ................... | G11C 13/004 |
| 2020/0401373 A1 | 12/2020 | Lesso | |
| 2021/0143834 A1 | 5/2021 | Kvatinsky et al. | |

OTHER PUBLICATIONS

EPO, partial European Search Report of the corresponding European Patent Application No. 22208036.8 dated Apr. 26, 2023.
EPO, European Search Report of the corresponding European Patent Application No. 22208036.8 dated Sep. 7, 2023.

* cited by examiner

[FIG.1]
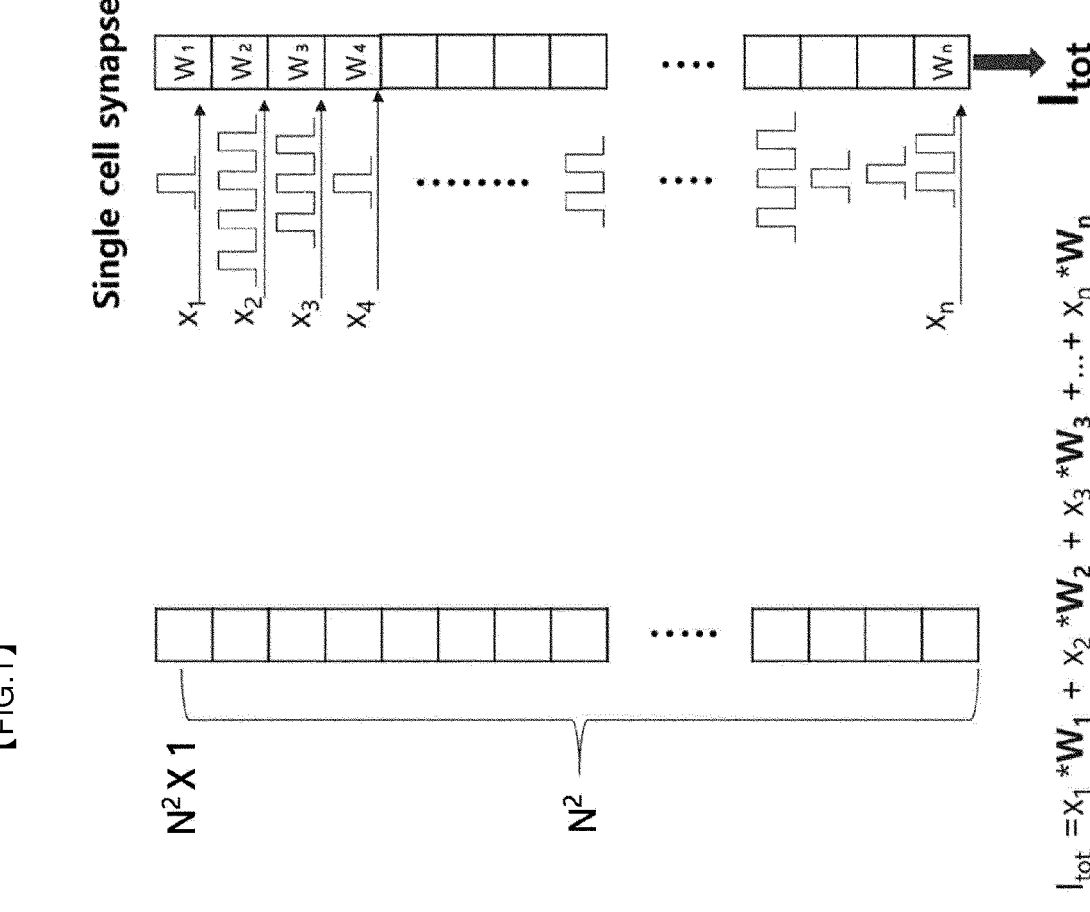
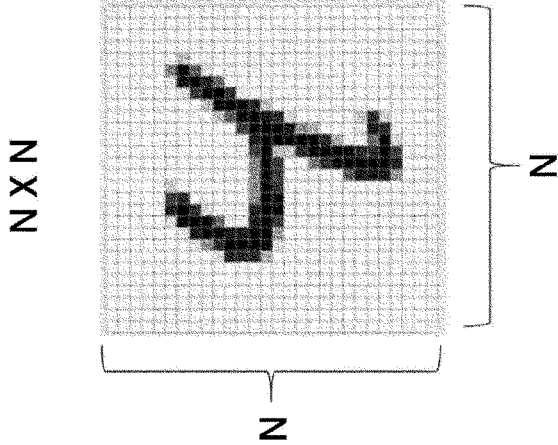
$$I_{tot} = X_1 {}^*W_1 + X_2 {}^*W_2 + X_3 {}^*W_3 + ... + X_n {}^*W_n$$

【FIG.2】
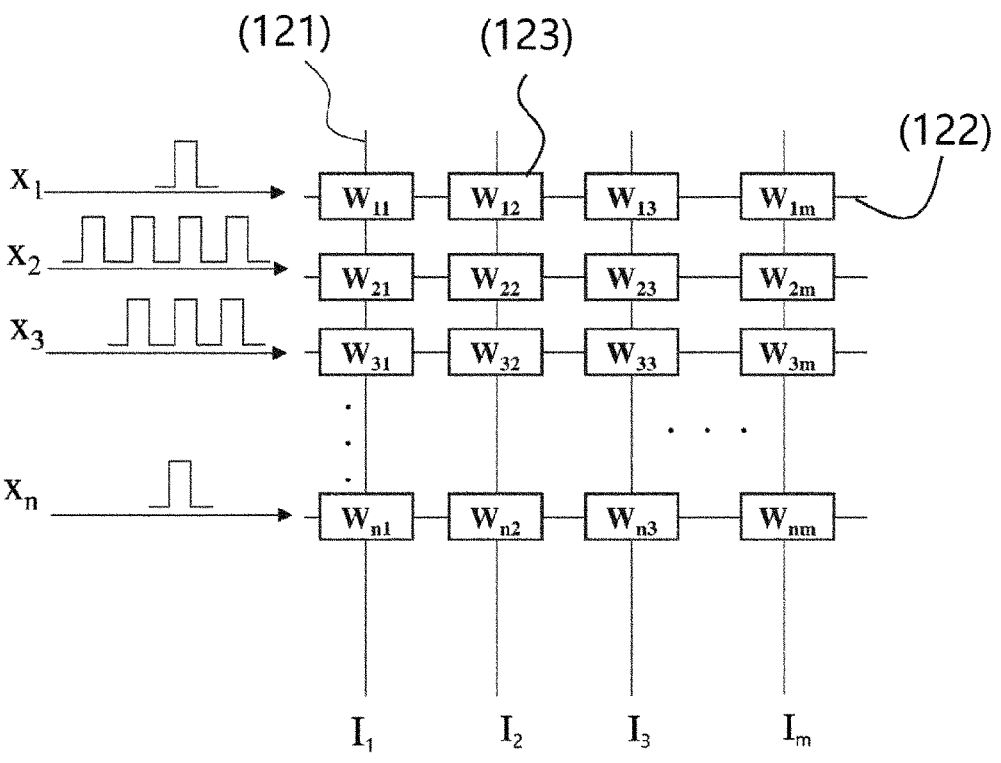
$$I_1 = x_1 * W_{11} + x_2 * W_{21} + x_3 * W_{31} + \ldots + x_n * W_{n1}$$
$$I_2 = x_1 * W_{12} + x_2 * W_{22} + x_3 * W_{32} + \ldots + x_n * W_{n2}$$
$$\vdots$$
$$I_m = x_1 * W_{1m} + x_2 * W_{2m} + x_3 * W_{3m} + \ldots + x_n * W_{nm}$$

【FIG.3】
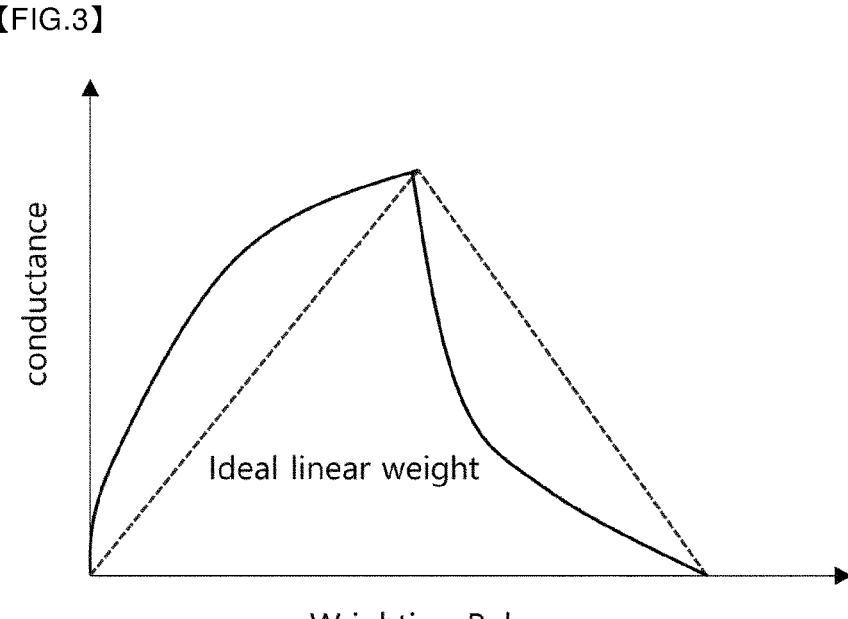
【FIG.4】
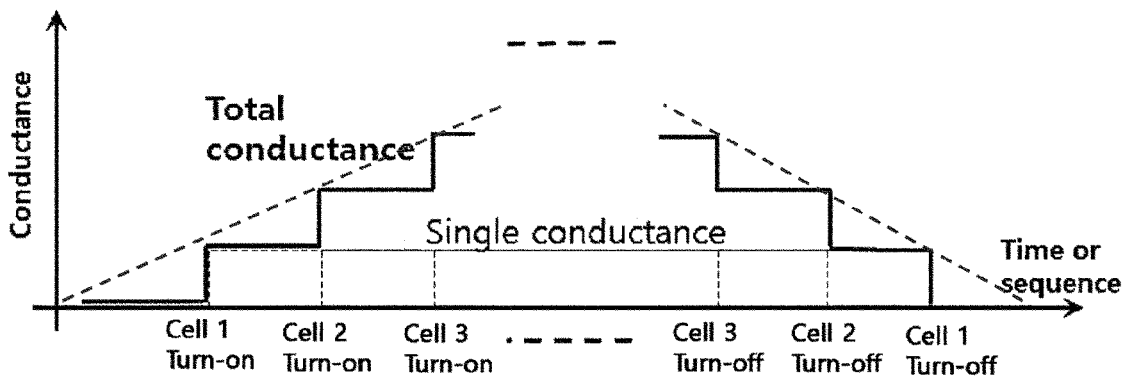

【FIG.5】
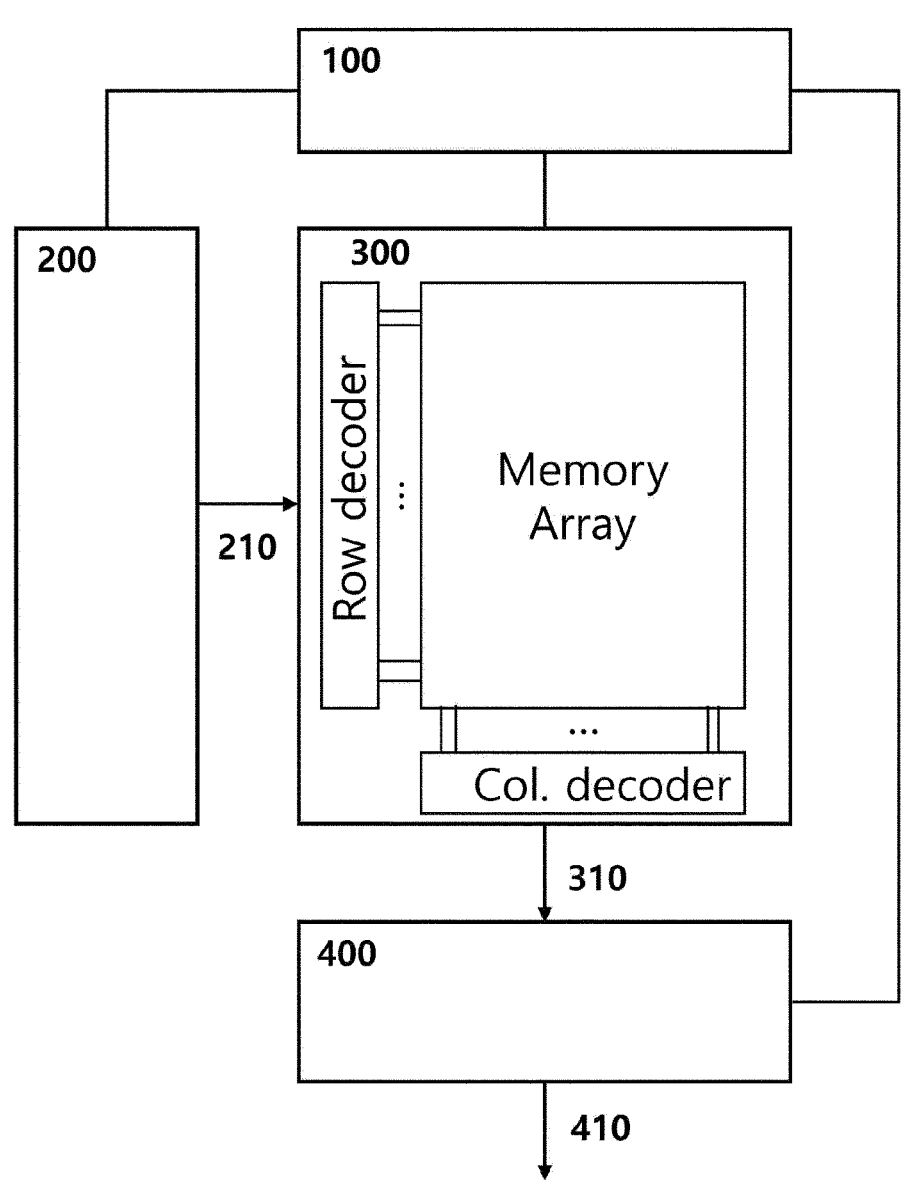

【FIG.6】
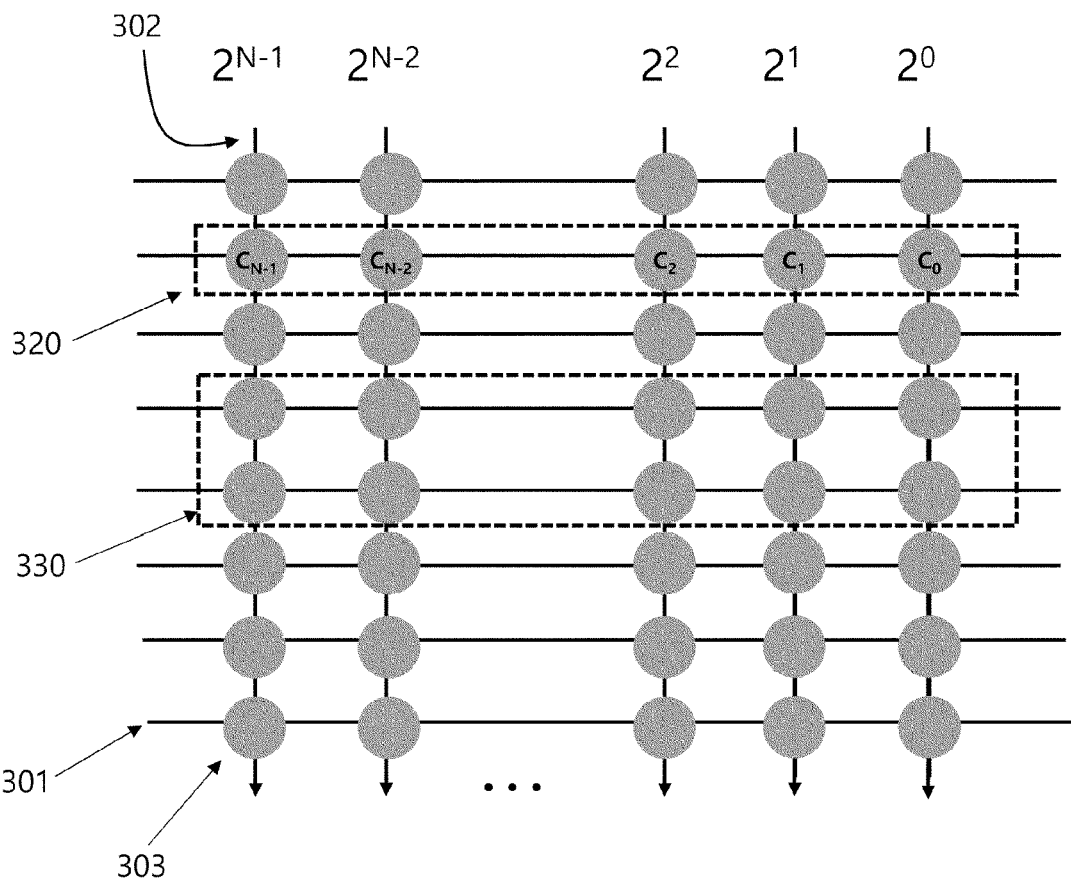

【FIG.7】
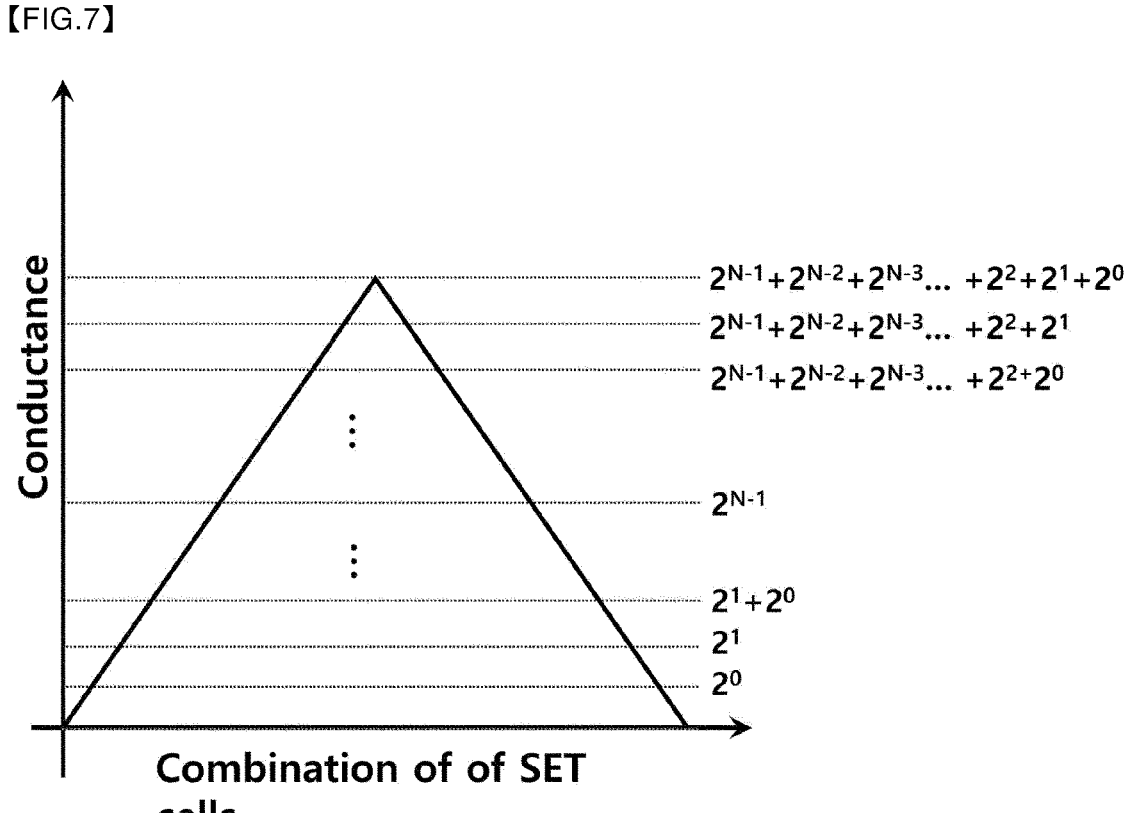
$2^{N-1}+2^{N-2}+2^{N-3}... +2^2+2^1+2^0$
$2^{N-1}+2^{N-2}+2^{N-3}... +2^2+2^1$
$2^{N-1}+2^{N-2}+2^{N-3}... +2^2+2^0$
$2^{N-1}$
$2^1+2^0$
$2^1$
$2^0$
Conductance
Combination of of SET cells

[FIG.8]

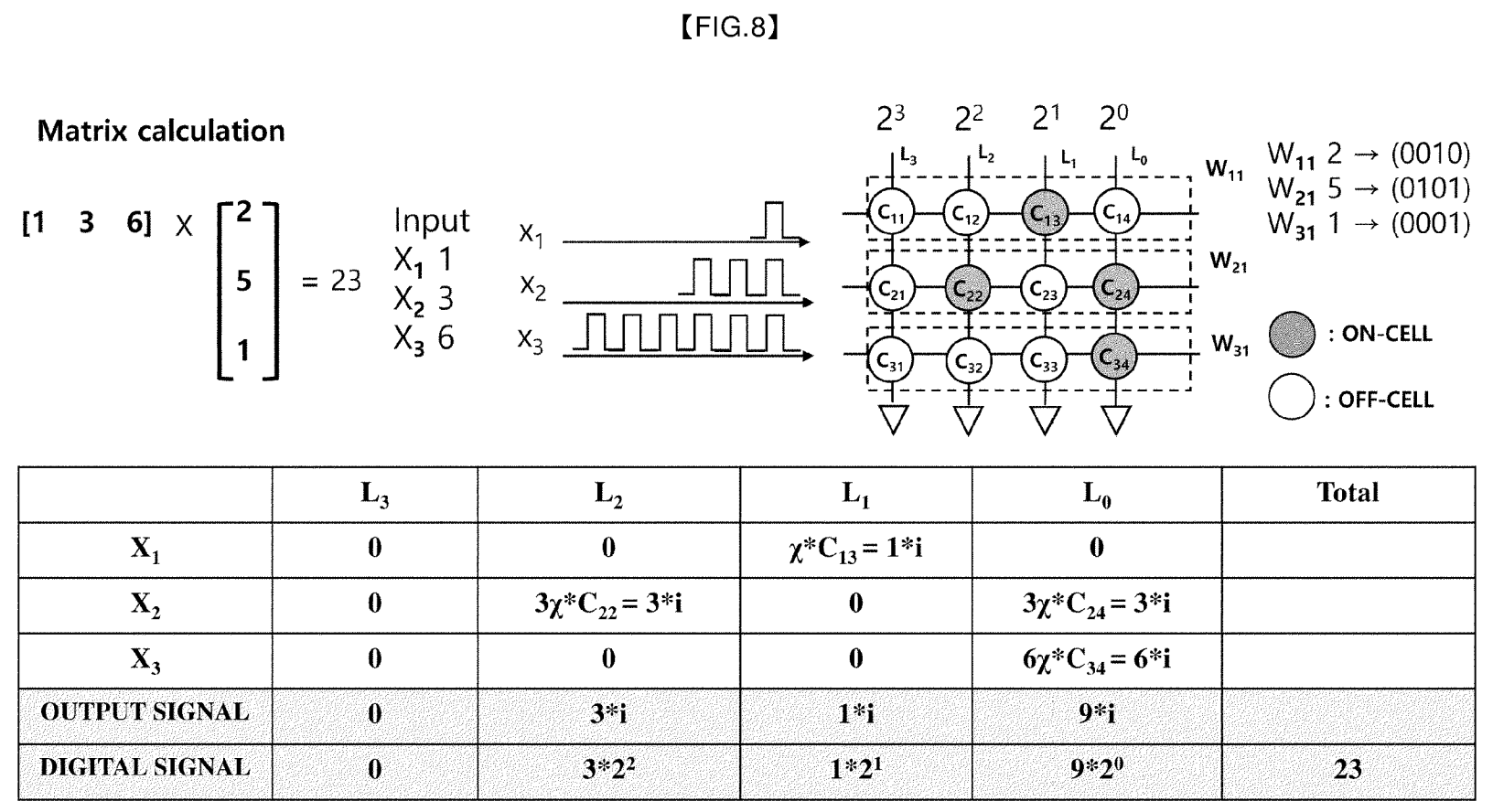

Matrix calculation

$$[1 \quad 3 \quad 6] \times \begin{bmatrix} 2 \\ 5 \\ 1 \end{bmatrix} = 23$$

Input
$X_1$ 1
$X_2$ 3
$X_3$ 6

$W_{11}$ $2 \rightarrow (0010)$
$W_{21}$ $5 \rightarrow (0101)$
$W_{31}$ $1 \rightarrow (0001)$

⬤ : ON-CELL
◯ : OFF-CELL

| | $L_3$ | $L_2$ | $L_1$ | $L_0$ | Total |
|---|---|---|---|---|---|
| $X_1$ | 0 | 0 | $\chi * C_{13} = 1*i$ | 0 | |
| $X_2$ | 0 | $3\chi * C_{22} = 3*i$ | 0 | $3\chi * C_{24} = 3*i$ | |
| $X_3$ | 0 | 0 | 0 | $6\chi * C_{34} = 6*i$ | |
| OUTPUT SIGNAL | 0 | $3*i$ | $1*i$ | $9*i$ | |
| DIGITAL SIGNAL | 0 | $3*2^2$ | $1*2^1$ | $9*2^0$ | 23 |

[FIG.9]
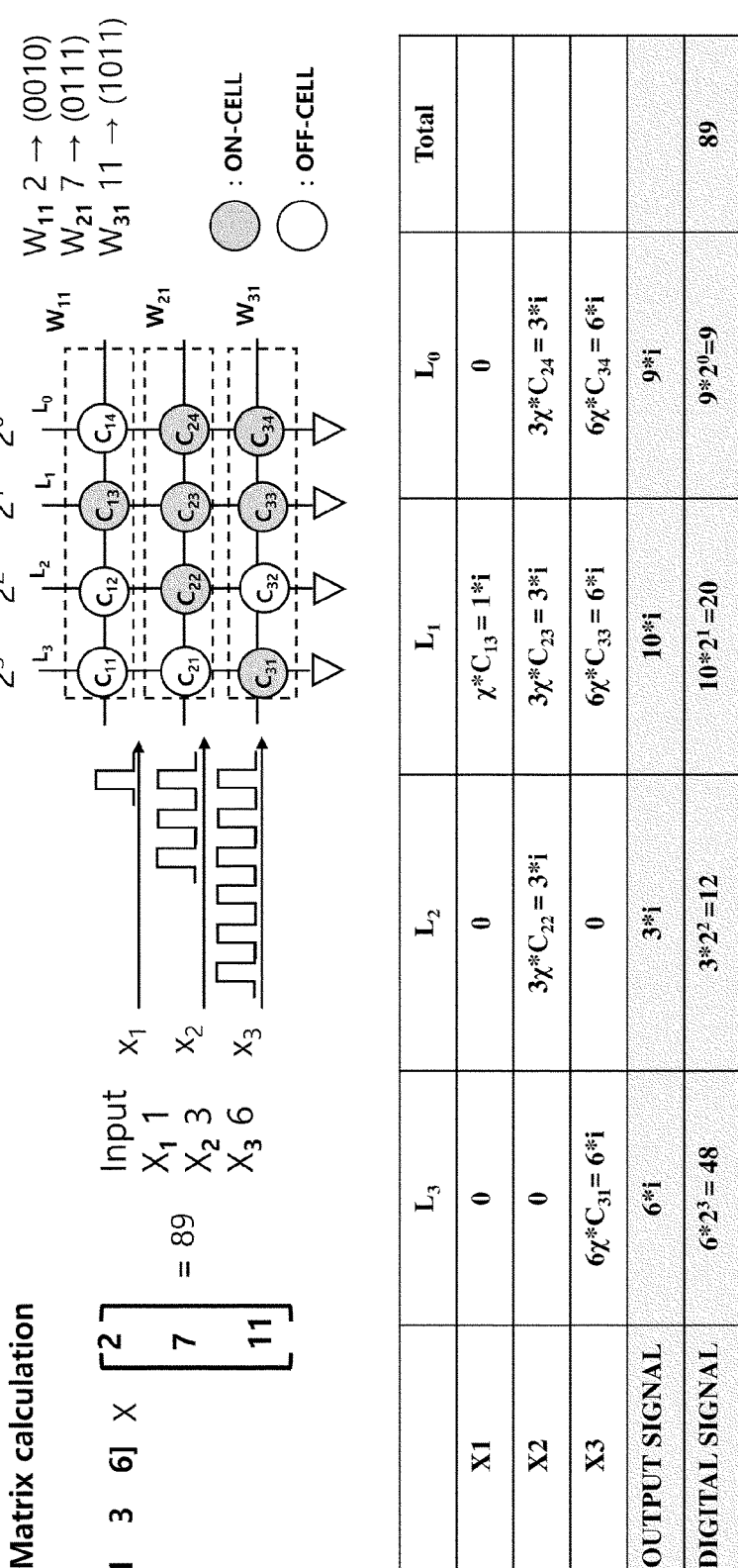

[FIG.10]

Matrix calculation

$$[1 \ 3 \ 6] \times \begin{bmatrix} 2 \\ 7 \\ 11 \end{bmatrix} = 89$$

Input
| | |
|---|---|
| $X_1$ | 1 |
| $X_2$ | 3 |
| $X_3$ | 6 |

$W_{11}$ $2 \rightarrow (02)$
$W_{21}$ $7 \rightarrow (13)$
$W_{31}$ $11 \rightarrow (23)$

: ON-CELL, $R_1$
: ON-CELL, $R_2$
: ON-CELL, $R_3$
: OFF-CELL

| | $L_3$ | $L_2$ | $L_1$ | $L_0$ | Total |
|---|---|---|---|---|---|
| $X_1$ | 0 | 0 | 0 | $\chi^*C_{14\text{-}2} = 1^*i_2$ | |
| $X_2$ | 0 | 0 | $3\chi^*C_{23\text{-}1} = 3^*i_1$ | $3\chi^*C_{24\text{-}3} = 3^*i_3$ | |
| $X_3$ | 0 | 0 | $6\chi^*C_{33\text{-}2} = 6^*i_2$ | $6\chi^*C_{34\text{-}3} = 6^*i_3$ | |
| OUTPUT SIGNAL | 0 | 0 | $3^*i_1+6^*i_2$ | $1^*i_2+9^*i_3$ | |
| DIGITAL SIGNAL | 0 | 0 | $(3^*1+6^*2)^*4^1=60$ | $(1^*2+9^*3)^*4^0=29$ | 89 |

[FIG.11]
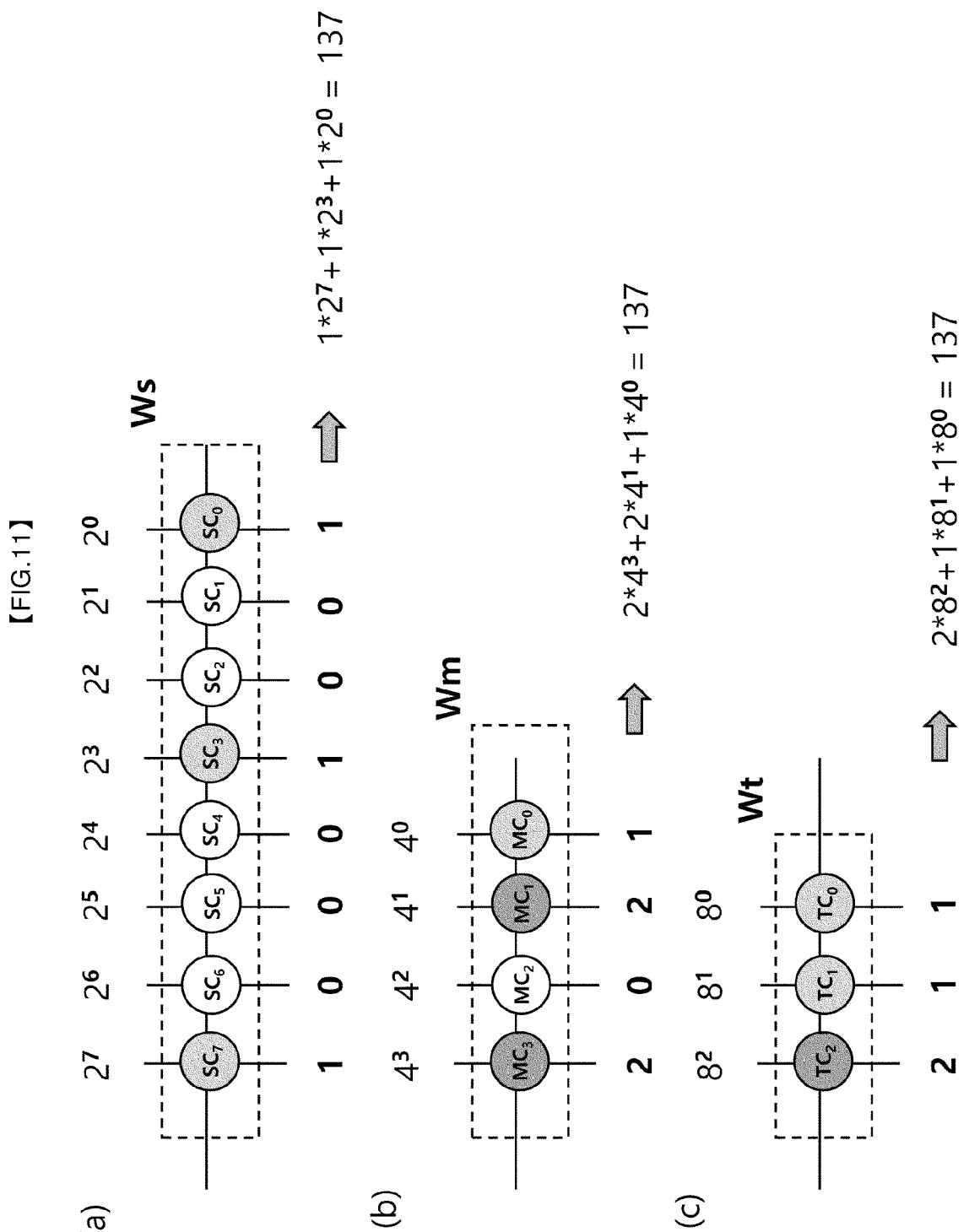

[FIG.12]
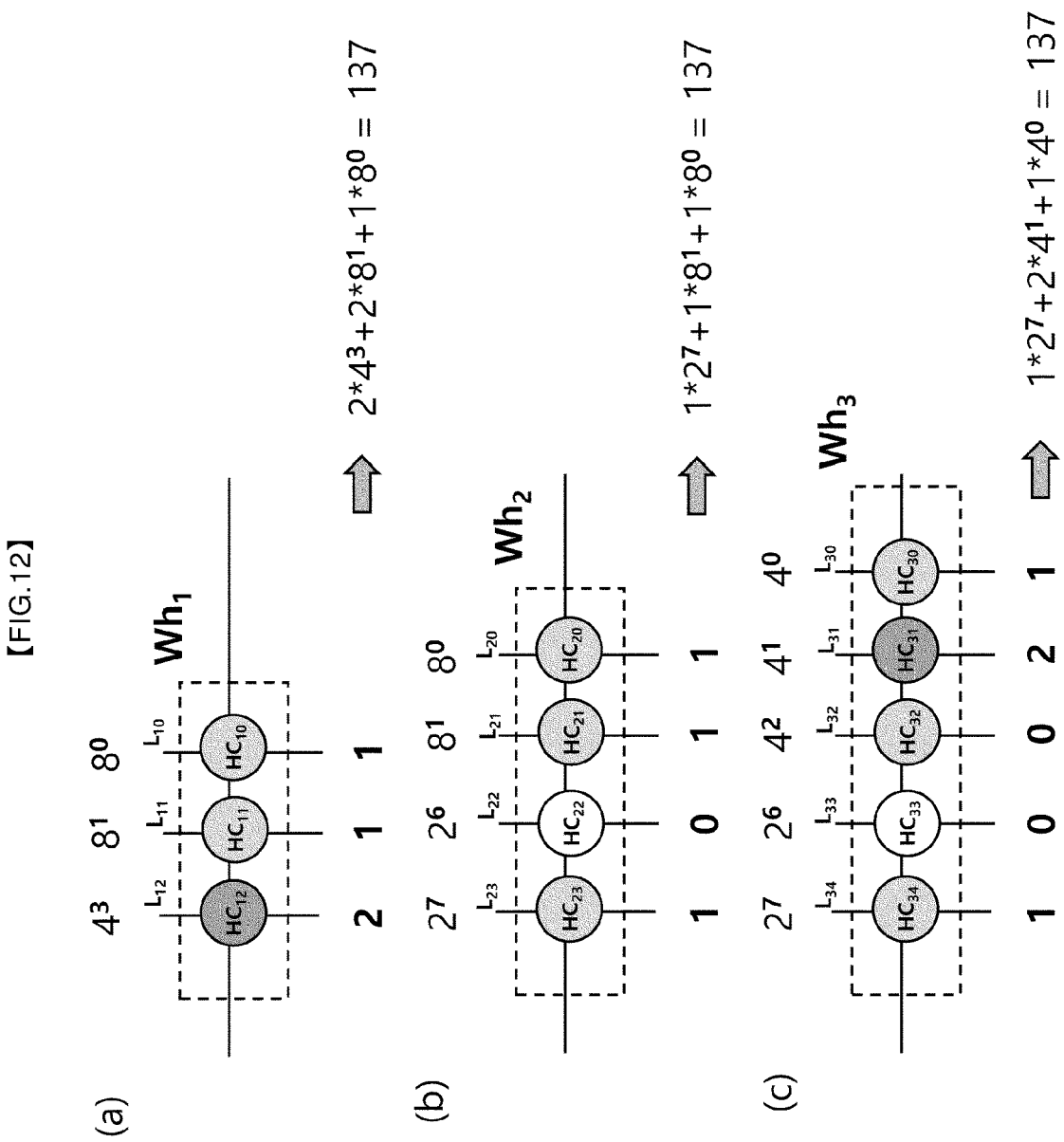

[FIG.13]

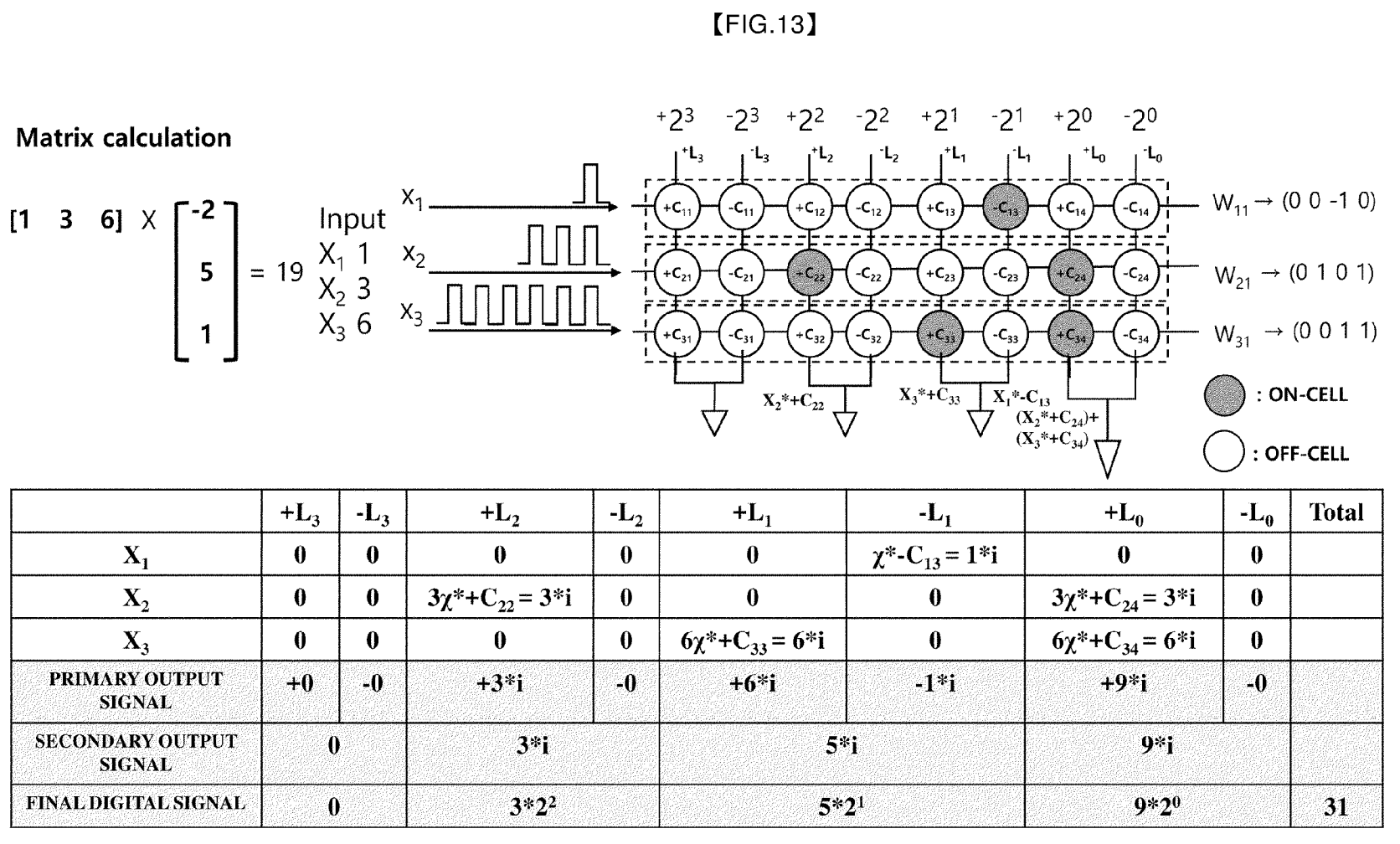

| | +L_3 | -L_3 | +L_2 | -L_2 | +L_1 | -L_1 | +L_0 | -L_0 | Total |
|---|---|---|---|---|---|---|---|---|---|
| $X_1$ | 0 | 0 | 0 | 0 | 0 | $\chi*-C_{13}=1*i$ | 0 | 0 | |
| $X_2$ | 0 | 0 | $3\chi*+C_{22}=3*i$ | 0 | 0 | 0 | $3\chi*+C_{24}=3*i$ | 0 | |
| $X_3$ | 0 | 0 | 0 | 0 | $6\chi*+C_{33}=6*i$ | 0 | $6\chi*+C_{34}=6*i$ | 0 | |
| PRIMARY OUTPUT SIGNAL | +0 | -0 | +3*i | -0 | +6*i | -1*i | +9*i | -0 | |
| SECONDARY OUTPUT SIGNAL | 0 | | 3*i | | 5*i | | 9*i | | |
| FINAL DIGITAL SIGNAL | 0 | | $3*2^2$ | | $5*2^1$ | | $9*2^0$ | | 31 |

[FIG.14]

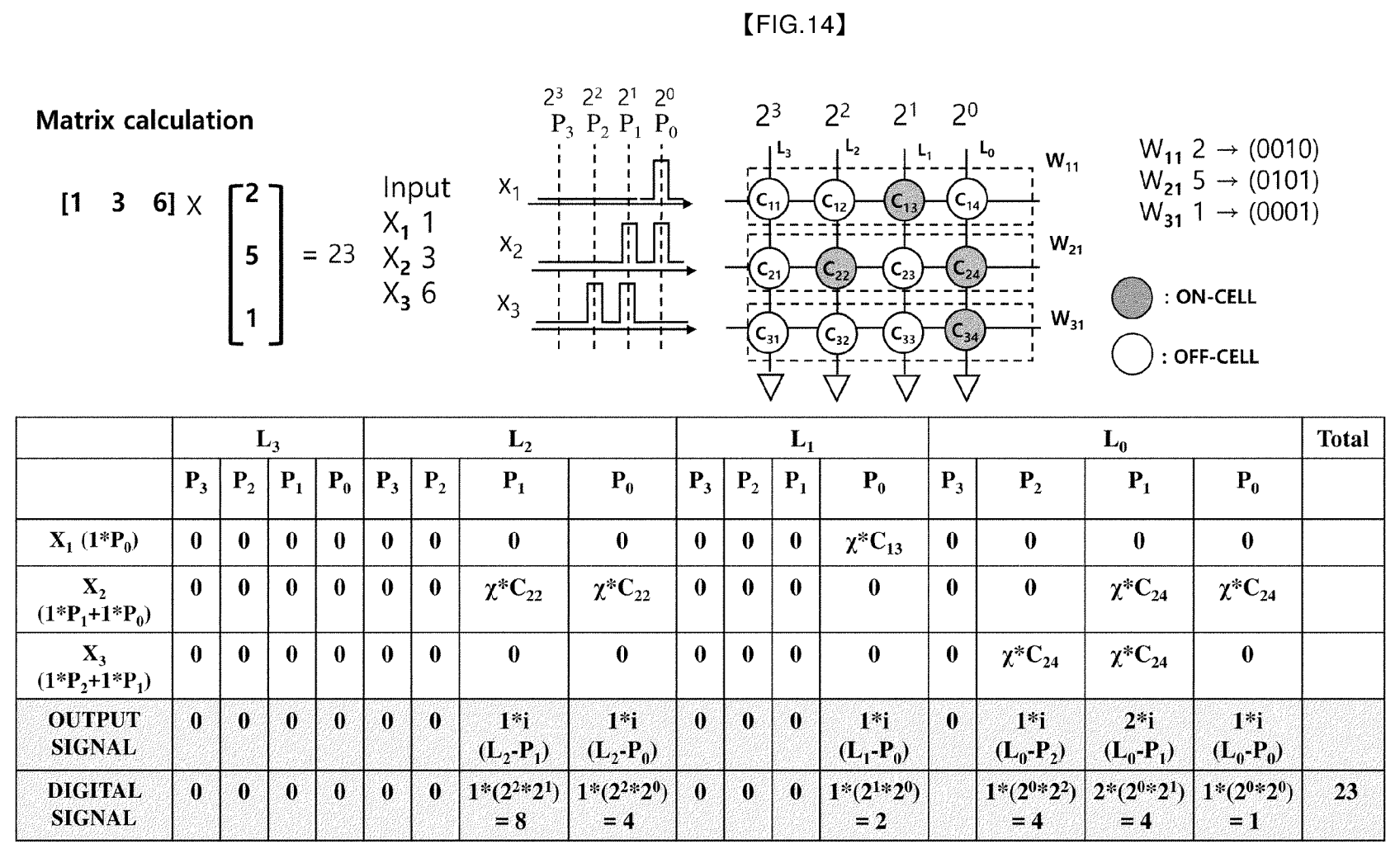

Matrix calculation

$$[1 \quad 3 \quad 6] \times \begin{bmatrix} 2 \\ 5 \\ 1 \end{bmatrix} = 23$$

Input
$X_1$ 1
$X_2$ 3
$X_3$ 6

$W_{11}$ 2 → (0010)
$W_{21}$ 5 → (0101)
$W_{31}$ 1 → (0001)

●: ON-CELL
○: OFF-CELL

| | $L_3$ | | | | $L_2$ | | | | $L_1$ | | | | $L_0$ | | | | Total |
|---|---|---|---|---|---|---|---|---|---|---|---|---|---|---|---|---|---|
| | $P_3$ | $P_2$ | $P_1$ | $P_0$ | $P_3$ | $P_2$ | $P_1$ | $P_0$ | $P_3$ | $P_2$ | $P_1$ | $P_0$ | $P_3$ | $P_2$ | $P_1$ | $P_0$ | |
| $X_1$ ($1*P_0$) | 0 | 0 | 0 | 0 | 0 | 0 | 0 | 0 | 0 | 0 | 0 | $\chi*C_{13}$ | 0 | 0 | 0 | 0 | |
| $X_2$ ($1*P_1+1*P_0$) | 0 | 0 | 0 | 0 | 0 | 0 | $\chi*C_{22}$ | $\chi*C_{22}$ | 0 | 0 | 0 | 0 | 0 | 0 | $\chi*C_{24}$ | $\chi*C_{24}$ | |
| $X_3$ ($1*P_2+1*P_1$) | 0 | 0 | 0 | 0 | 0 | 0 | 0 | 0 | 0 | 0 | 0 | 0 | 0 | $\chi*C_{24}$ | $\chi*C_{24}$ | 0 | |
| OUTPUT SIGNAL | 0 | 0 | 0 | 0 | 0 | 0 | $1*i$ ($L_2$-$P_1$) | $1*i$ ($L_2$-$P_0$) | 0 | 0 | 0 | $1*i$ ($L_1$-$P_0$) | 0 | $1*i$ ($L_0$-$P_2$) | $2*i$ ($L_0$-$P_1$) | $1*i$ ($L_0$-$P_0$) | |
| DIGITAL SIGNAL | 0 | 0 | 0 | 0 | 0 | 0 | $1*(2^2*2^1)$ =8 | $1*(2^2*2^0)$ =4 | 0 | 0 | 0 | $1*(2^1*2^0)$ =2 | 0 | $1*(2^0*2^2)$ =4 | $2*(2^0*2^1)$ =4 | $1*(2^0*2^0)$ =1 | 23 |

【FIG.15】
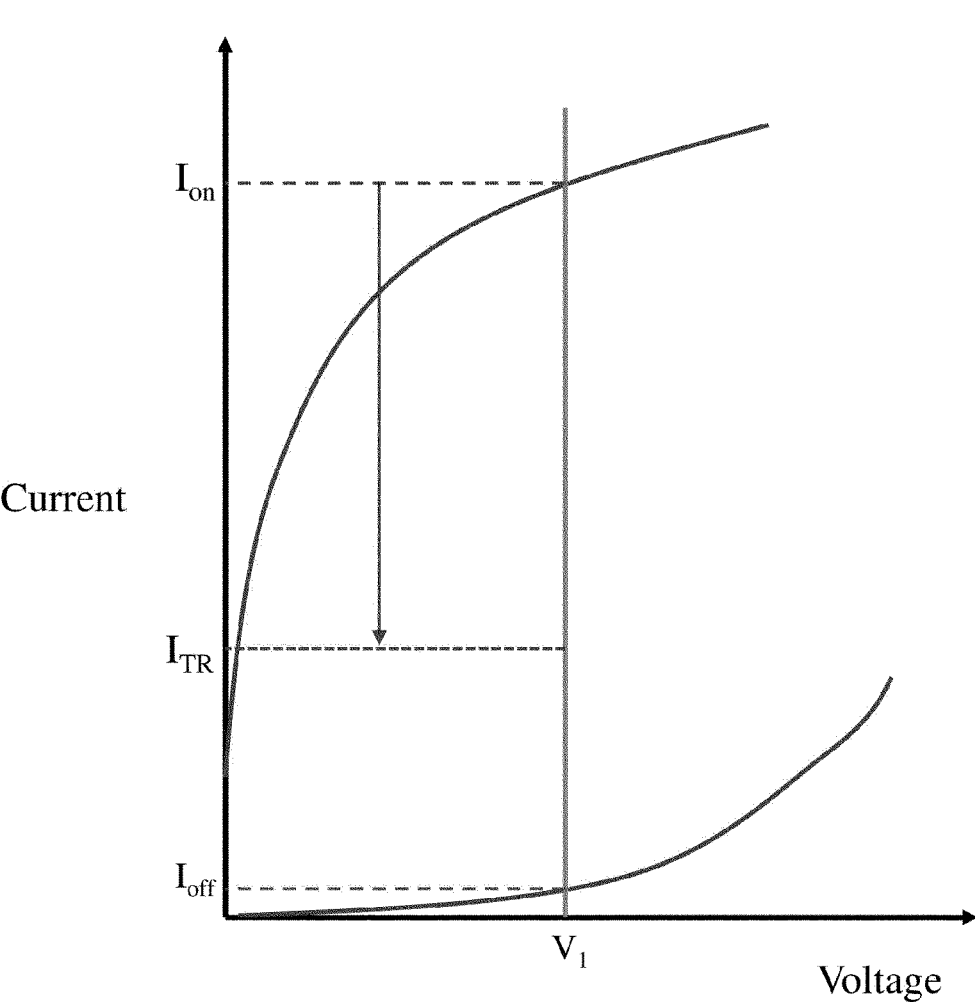

【FIG.16】
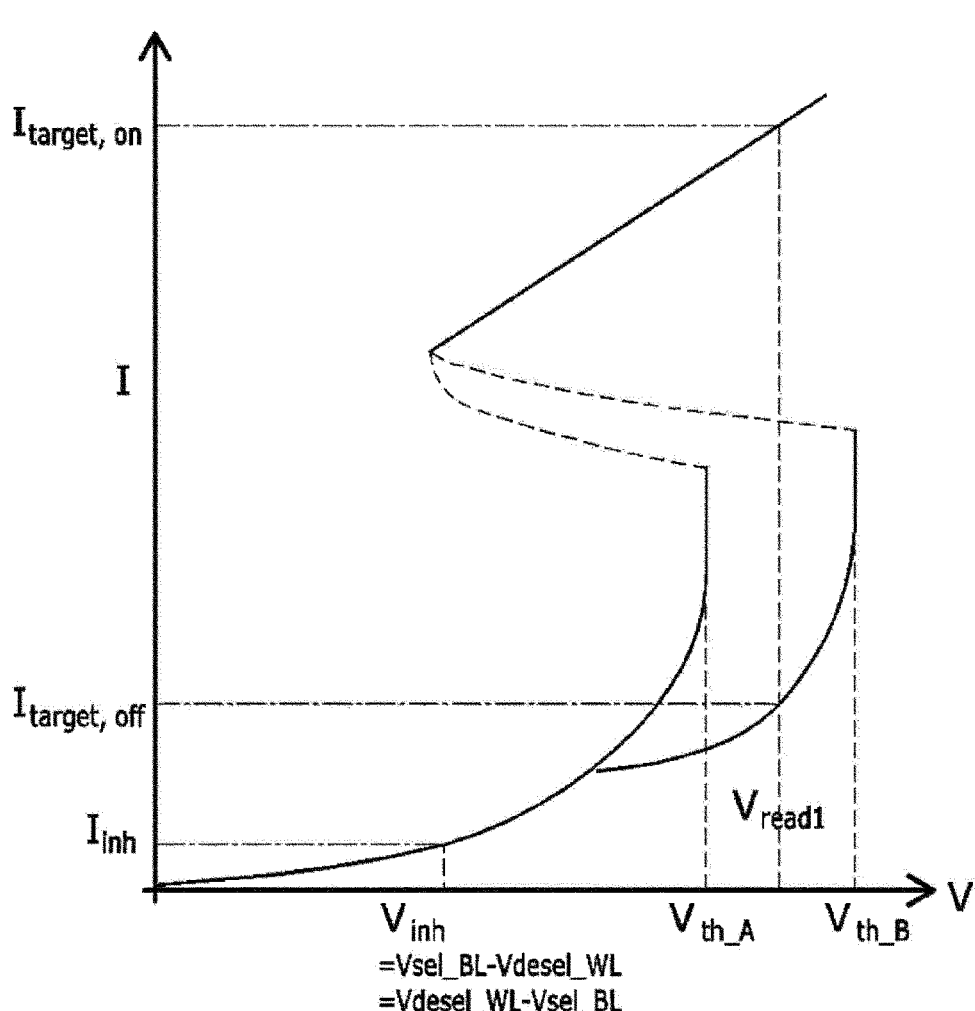

【FIG.17】
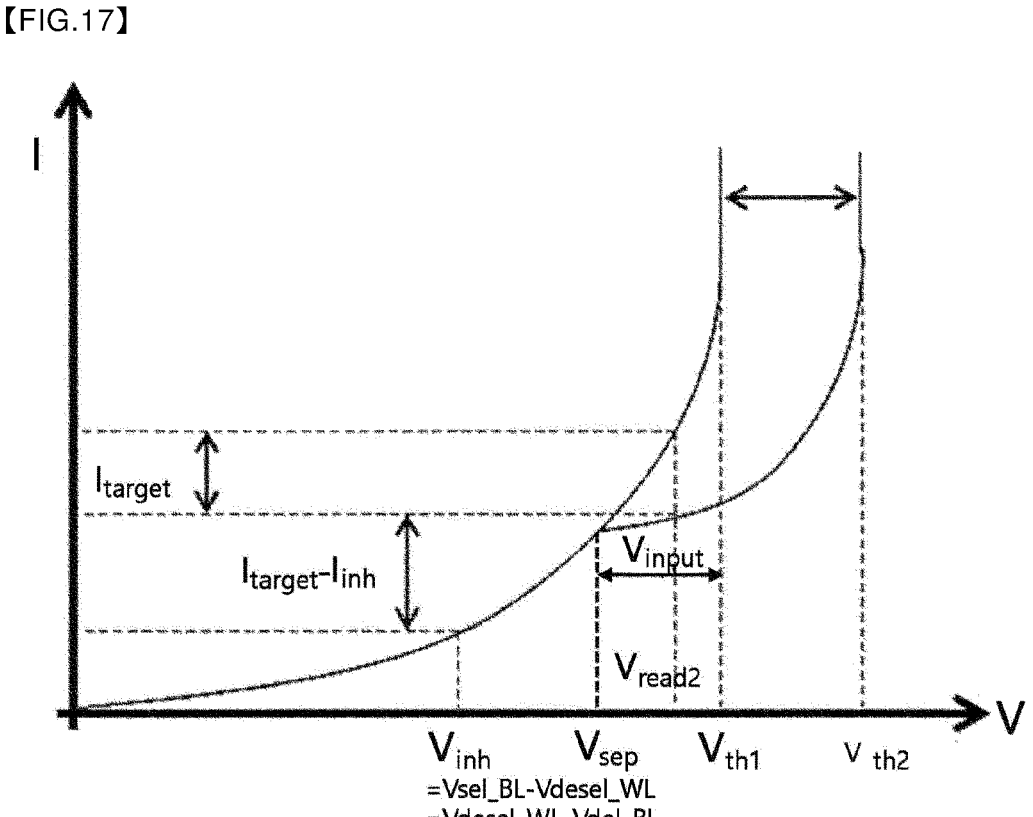

[FIG.18]
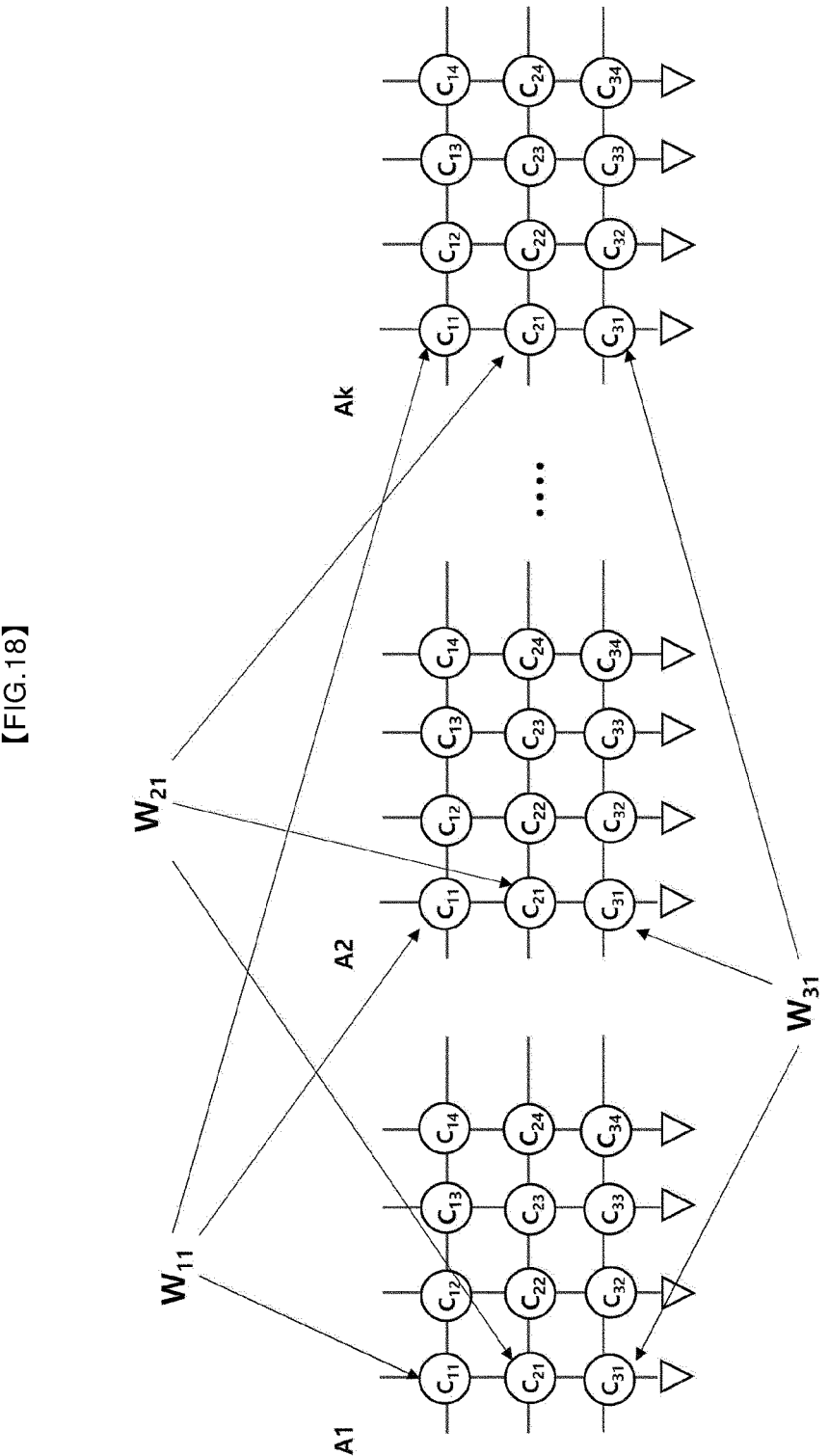

ANALOG-DIGITAL HYBRID COMPUTING METHOD AND NEUROMORPHIC SYSTEM USING THE SAME

BACKGROUND OF THE INVENTION

1. Field of the Invention

The present invention relates to utilizing a memory device capable of controlling a gradual resistance change in implementing a neuromorphic system. More specifically, the present invention relates to the neuromorphic system detecting a current flowing from a plurality of memory cells by an analog-digital hybrid computing method while allowing a plurality of selected memory cells to be recognized and operated as one synaptic unit and a method for operating the same.

2. Description of the Related Art

The artificial intelligence semiconductor industry is currently in its infancy. Recently, semiconductor design and manufacturing companies have begun to release prototypes or early products. These prototypes and initial products are all first-generation artificial intelligence semiconductor products based on CMOS, and from a memory point of view, they are no different from existing semiconductor products, and new memories are expected to be introduced and used in the second-generation artificial intelligence semiconductor in earnest.

For the second-generation artificial intelligence semiconductor with a degree of integration similar to that of a biological neural network, an artificial synapse with all the key characteristics of a biological synapse should be implemented as one element. A synapse of the biological system accompanies a change in synaptic weight in the process of processing a signal transmitted from a neuron, and, through this, exerts learning and memory functions. Therefore, an artificial synaptic element aims to simulate this so that the change in synaptic weight is expressed as a current (or resistance), thereby exerting the learning and memory functions. Therefore, in order to achieve this purpose, it is very important to develop an element in which a controllable and distinguishable gradual change in current (or resistance) can be made. For the most ideal artificial synaptic element, the gradual change in current (or resistance) is one in which a change in current (or resistance) occurs in precisely proportion to the number of pulses applied.

To achieve this purpose, various artificial synaptic elements have been proposed and manufactured. In the technology that has been studied in the semiconductor field for synaptic elements, research has been conducted in the direction of implementing high resistance change of an on-off digital method by a method of storing information in each cell by distinguishing between a low-resistance state and a high-resistance state in a memory array using an element that can change resistance, such as RRAM, PRAM, or MRAM, and reading a logic state of a cell in the memory array according to the resistance change.

However, for the artificial synaptic element, not only does one element need to have a wide variety of resistance states, but these resistance states also need to be controlled. Although a lot of research and development has been made on these elements using the RRAM element, the PRAM element, etc., there is still a lot of asymmetry or lack of repeatability, and thus it is still insufficient to achieve a level where simultaneous control is possible while creating a discriminative resistance state.

SUMMARY OF THE INVENTION

The present invention addresses the above-identified, and other problems associated with conventional methods and apparatuses.

An object of the invention is to provide a neuromorphic system that digitizes an analog output signal in a synaptic unit including a plurality of memory cells, and a method for operating the same.

According to an embodiment of the invention, there is provided a neuromorphic system including an input signal section that generates an input signal, a synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an output signal for each output electrode line by the input signal, a digital calculation section that digitizes the output signal generated for each output electrode line and calculates a sum of the digitized output signals, and a controller section that controls the input signal section, the synapse section, and the digital calculation section, in which the controller section designates a number of digitized digits for each output electrode line and stores the logic state in the plurality of non-volatile memory cells according to a predetermined weight in each of the plurality of synaptic units, causes the input signal generated by the input signal section to be applied to each of a plurality of non-volatile memory cells of each of the plurality of synaptic units through the input electrode lines, generates, as the output signal, a sum of currents, that flows from the plurality of non-volatile memory cells of each of the plurality of synaptic units by the applied input signal, for each output electrode line, and causes the digital calculation section to digitize the output signal generated for each output electrode line according to the number of digits and calculate the sum of the digitized output signals.

Further, in the neuromorphic system according to the embodiment of the invention, the controller section may cause the input signal generated from the input signal section to be one or more pulses having the same width and height, causes the one or more pulses to be sequentially applied to the synapse section according to the order of generation and cause the numbers of digitized digits in pulse different from each other to be designated to the one or more pulses according to the order of generation, cause the output signal to be sequentially generated for each of the pulses sequentially applied, and cause the digital calculation section to digitize the output signal generated for each output electrode line for each of the pulses according to the number of digits in pulse according to the order of generation of the pulse and the number of digits of the output electrode line, and to calculate the sum of the digitized output signals.

According to another embodiment of the invention, there is provided a method for operating a neuromorphic system, which includes n input signal section that generates an input signal, synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an output signal for each output electrode line by the input signal, a digital calculation section that digitizes the output signal generated for each output electrode line and calculates a sum of the digitized output signals, and a controller section that controls the input signal section, the synapse section, and the digital calculation section, the method including (a) a step of designating a number of digitized digits for each output electrode line and storing the logic state in the plurality of non-volatile memory cells according to a predetermined weight in each of the plurality of synaptic units, (b) a step of generating an input signal by the input signal section, and causing the input signal to be applied to each of a plurality of non-volatile memory cells of each of the plurality of synaptic units through the input electrode lines, (c) a step of generating, as the output signal for each output electrode line, a sum of currents, that flows from the plurality of non-volatile memory cells by the applied input signal for each output electrode line, (d) a step of digitizing the output signal according to the number of digits for each output electrode line, and (e) a step of calculating the sum of the digitized output signals.

Further, in the method for operating the neuromorphic system according to another embodiment of the invention, in said step (b), the input signal is one or more pulses which have the same width and height and to which the numbers of digitized digits in pulse different from each other are designated according to the order of generation such that the one or more pulses are sequentially applied to the plurality of non-volatile memory cells according to the order of generation, in said step (c), the output signal is sequentially generated for each of the pulses sequentially applied, and in said step (d), the output signal is digitized according to the number of digits in pulse according to the order of generation of the pulse and the number of digits of the output electrode line.

Through the invention, a new neuromorphic system with high accuracy, smaller size, and low power consumption is possible.

BRIEF DESCRIPTION OF THE DRAWINGS

FIG. 1 is a conceptual diagram illustrating vector matrix multiplication for image recognition;

FIG. 2 is a conceptual diagram illustrating vector matrix multiplication using a memory array;

FIG. 3 is a graph illustrating a change in conductivity of a cell according to a writing pulse;

FIG. 4 is a graph illustrating a change in conductivity according to the number of turn-on cells when one synapse is represented by a plurality of memory cells;

FIG. 5 is a diagram illustrating a structure of a neuromorphic system according to the invention;

FIG. 6 is a diagram illustrating an embodiment in which a plurality of memory cells form one synapse according to the invention;

FIG. 7 is a graph illustrating a change in conductivity through a combination of a plurality of memory cells forming one synapse according to the invention;

FIG. 8 is a diagram illustrating that vector matrix multiplication is performed through an embodiment according to the invention;

FIG. 9 is a diagram illustrating that vector matrix multiplication is performed through an embodiment according to the invention;

FIG. 10 is a diagram illustrating that vector matrix multiplication is performed through an embodiment according to the invention;

FIG. 11 is a diagram illustrating setting of a synaptic weight according to a memory cell forming a synapse in an embodiment according to the invention;

FIG. 12 is a diagram illustrating setting of a synaptic weight according to a memory cell forming a synapse in an embodiment according to the invention;

FIG. 13 is a diagram illustrating that vector matrix multiplication is performed through an embodiment according to the invention;

FIG. 14 is a diagram illustrating that vector matrix multiplication is performed through an embodiment according to the invention;

FIG. 15 is a graph illustrating limiting a current flowing in a memory cell when a transistor is used as a selection element in an embodiment according to the invention;

FIG. 16 is a graph illustrating a method of applying a reading voltage when a two-terminal switching element or selective-memory element is used as a selection element in the prior art;

FIG. 17 is a graph illustrating a method of applying a reading voltage when a two-terminal switching element or selective-memory element is used as the selection element in an embodiment according to the invention; and FIG. 18 is a diagram illustrating that a plurality of memory cells belonging to one synaptic unit are arranged in a plurality of memory arrays in an embodiment according to the invention.

DETAILED DESCRIPTION OF THE EXEMPLARY EMBODIMENTS

Hereinafter, a configuration and operation of the embodiment of the invention will be described with reference to the accompanying drawings. In the following description of the invention, when it is determined that a detailed description of a related well-known function or configuration may unnecessarily obscure the gist of the invention, the detailed description thereof will be omitted. Further, when a portion 'includes' a certain component, this means that other components may be further included, rather than excluding other components, unless otherwise stated.

In the invention, a new neuromorphic system and a method for operating the same will be described.

In deep learning algorithms, a vector-matrix multiplication (VMM) operation is a key computing operation for learning and inference.

When describing a VMM method for recognizing an image with reference to FIG. 1, the image is divided into N×N regions, a weight is set on each of the regions, and information such as brightness and darkness is input as various input signals. When expressing this using a neuromorphic system, an input signal $X_i$ is a signal from a pre-neuron, an output current $I_{tot}$ is an output signal to a post-neuron, and $W_i$ is a weight multiplied through a synapse with respect to the input signal. In this way, the image is recognized by comparing $I_{tot}$, which is the current that appears through a sum of a product of the input signal and the weight, with a reference value and finding a synapse having the closest weight.

However, there are many problems in realizing such an operation in an existing computing system, such as a problem of power consumption and a problem of an apparatus size.

In order to solve this problem, recent research is actively trying to solve this problem using new memories such as a resistive random access memory (RRAM), phase change random access memory (PRAM), magnetic random access memory (MRAM), and ferroelectric random access memory (FeRAM), which are non-volatile memories.

In general, a memory array using the new memories has a structure in which input electrode lines and output electrode lines cross each other and the input electrode lines and the output electrode lines are connected to each other through memory cells at the intersection points.

The VMM through such a memory array is described with reference to FIG. 2. In FIG. 2, when an input signal that can be expressed as a vector $X_i$ is applied to a row metal line 122 while maintaining a column metal line 121 in a grounded state, the current flowing through each memory cell at a cross-point (i, j) becomes $X_i W_{ij}$ ($X_i$ is the applied voltage, and $W_{ij}$ is the conductivity of the memory cell). Since the current flowing through these column line 121 becomes the sum of the currents flowing through the memory located in the same column line 121, $I_j = X_1 * W_{1j} + X_2 * W_{2j} + X_3 * W_{3j} + \ldots + X_n * W_{nj}$ (in FIG. 2, j is 1 to m).

In this way, an inference process is performed by comparing each of m currents $I_1$ to $I_m$ output through the column line 121 with the reference value.

Here, the input signal $X_i$ is an analog signal, and may be pulses having a constant width and different heights, pulses having a constant height and different widths, or pulses having a constant width and height and different times. The $W_{ij}$, which is a weight, may be expressed through the conductivity of the memory cell at each point of the memory array.

By the way, the weight $W_{ij}$ here corresponds to the conductivity of the memory cell. In order to increase the accuracy of inference, various values, that is, various conductivities, should be stored in the memory cell in stages. Since the accuracy of inference increases as the diversity increases, the development of new memory capable of storing conductivity of various stages is active for this purpose, but satisfactory results have not been obtained yet.

This is shown in FIG. 3. In a memory cell such as RRAM, if the conductivity is measured while increasing a writing pulse to change the conductivity corresponding to a synaptic weight, the conductivity of the memory cell is changed, but it does not change to an ideal straight line (dotted line in FIG. 3) but draws a curve (solid line in FIG. 3). Furthermore, these curves do not show the same curve repeatedly and are constantly changing. That is, in the case of the synaptic unit using a memory cell such as one RRAM, not only does the conductivity of the memory cell corresponding to the weight not increase or decrease linearly, but also the change in conductivity varies each time it is measured, thereby making it practically impossible to increase the accuracy of the inference.

In order to overcome such a phenomenon, there have been attempts to control the conductivity change of the memory cell in a form that is easy to infer through a peripheral circuit, etc., but such an attempt complicates the neuromorphic system and lowers the operation speed, and the conductivity change of the memory cell is not controlled to a satisfactory level.

In order to improve the problems of the prior art, a new neuromorphic system capable of exhibiting various changes in conductivity by using a plurality of memory cells instead of one memory cell as a synaptic unit, and an operation method using the same have been proposed. In the new neuromorphic system and operation method using the same, by utilizing a plurality of cells rather than one cell as the synaptic unit, the weight of the synaptic unit can be expressed in various ways through a linear and predictable resistance change (see FIG. 4)

The synaptic unit including a plurality of memory cells is able to gradually change the conductivity of the synaptic unit according to the increase and decrease of the number of on cells, that is, memory cells in a low-resistance state among the plurality of memory cells, and such changes become linear and predictable.

On the other hand, by using a plurality of memory cells as one synaptic unit in this way, the weight of the synaptic unit can be expressed in various ways through the sum of the currents flowing through the plurality of memory cells, but there is a problem in that the number of utilized memory cells increases.

In order for the synaptic unit to represent a weight in the range of 1 to 256, if the memory cell can store a 1-bit logic state, 256 memory cells are needed.

If a plurality of memory cells are utilized for the synaptic unit in this way, a linear and predictable resistance change is possible, but as the number of memory cells used increases, there is a problem in that the size and manufacturing cost of the apparatus increase.

Therefore, it is necessary to reduce the number of memory cells used to an appropriate level. To this end, in the invention, the number of memory cells used can be reduced by outputting the sum of analog currents flowing from the plurality of memory cells as a digital signal while using a plurality of memory cells as the synaptic unit.

In detail, in the invention, a neuromorphic system, which includes an input signal section that generates an input signal, a synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an output signal for each output electrode line by the input signal, a digital calculation section that digitizes the output signal generated for each output electrode line and calculates a sum of the digitized output signals, and a controller section that controls the input signal section, the synapse section, and the digital calculation section, and in which the controller section designates the number of digitized digits for each output electrode line and stores the logic state in the plurality of non-volatile memory cells according to a predetermined weight in each of the plurality of synaptic units, causes the input signal generated by the input signal section to be applied to each of a plurality of non-volatile memory cells of each of the plurality of synaptic units through the input electrode lines, designates the number of digitized digits for each output electrode line in the synapse section, generates, as the output signal, a sum of currents, that flows from the plurality of non-volatile memory cells of each of the plurality of synaptic units by the applied input signal, for each output electrode line, and causes the digital calculation section to digitize the output signal generated for each output electrode line according to the number of digits and calculate the sum of the digitized output signals, may be provided.

The neuromorphic system according to the invention includes a plurality of synaptic units capable of having various weights, and each of these synaptic units includes a plurality of non-volatile memory cells each of which is able to store a logic state. These non-volatile memory cells are arranged at the intersections of the output electrode lines and the input electrode lines to form a memory array. First, the number of digitized digits is designated for each of these output electrode lines, and a logic state according to the number of digits for each electrode line it is stored in a plurality of non-volatile memories arranged in the memory array, according to a predetermined weight for each synaptic unit is stored in a plurality of nonvolatile memories disposed in the memory array.

When an input signal is applied to a synapse section including the plurality of synaptic units each of which includes a plurality of memory cells in each of which a logic state is stored, the synapse section converts the applied input signal into an output signal according to the stored weight and generates the output signal. In this case, the output signal is generated for each output electrode line in which the non-volatile memory cells are arranged.

Accordingly, the output signal generated at one output electrode line becomes the sum of the currents flowing through the non-volatile memory cells on the output electrode line. In this way, the output signal generated for each output electrode line becomes the sum of currents flowing from various memory cells and appears in an analog form. Meanwhile, the number of digitized digits is determined for each output electrode line. The output signal in an analog form is converted into a digital signal in the digital calculator according to the number of digits of the output electrode line to which the generated output signal corresponds. In this way, data necessary for artificial intelligence inference can be obtained by summing and calculating the output signals generated for each output electrode line and converted into digital signals.

This neuromorphic system and calculation steps through it will be described in more detail with reference to FIGS. 5 to 7.

The neuromorphic system according to the invention includes an input signal section 200 that generates an input signal 210, a synapse section 300 that receives the input signal 210 from the input signal section 200 and generates an output signal 310 for each output electrode line according to a set weight, a digital calculation section 400 that digitizes the output signal 310 generated for each output electrode line and transmits a digital signal 410, and a controller section 100 that controls the entire system.

FIG. 6 is a diagram illustrating that the number of digits is designated for each output electrode line and, accordingly, the synaptic weight is indicated through a gradual change in resistance.

The synapse section includes one or more memory arrays. The memory array includes an input electrode line 301 and an output electrode line 302 that cross each other, and memory cells 303 formed at the intersection of these electrode lines and connected to each other.

Synaptic units 320 and 330 included in the synapse section include a plurality of memory cells 303 arranged in the memory array of such a cross-point structure. In FIG. 6, a case 320 where N memory cells included in one synaptic unit are arranged in a row on one input line and a case 330 where 2N memory cells are arranged in two input electrode lines are illustrated. However, these cases are only one of the embodiments, and the memory cells may be arranged on the memory array in various cases, such as a case where 3N memory cells 303 are arranged on three input electrode lines or a case where N memory cells 303 are arranged on N input electrode lines in one output electrode line.

In the case of the synaptic unit 320 including N memory cells 303 in one input line, the N memory cells $C_0$ to $C_{N-1}$ have the number of digitized digits different from each other $2^0$ to $2^{N-1}$ for each output electrode line 302 by setting the number of digitized digits for each arranged output electrode line 302. These memory cells $C_0$ to $C_{N-1}$ can express the weight of the synaptic unit through a state of high resistance and low resistance. These memory cells are in the same on-cell state (i.e., the state of low resistance) and thus, even though the currents flowing along the output electrode lines are the same, when these currents are received as output signals and calculated by the digital calculation section, they are calculated as different values according to the number of digitized digits $2^0$ to $2^{N-1}$. That is, in a case where only the first digit memory cell $C_0$ is in the on-cell state, when the current flowing therefrom is an individual current i, this individual current i is transmitted to the digital calculation section as an output signal, and the digital calculation section recognizes this output signal as $2^0 \times i$ and digitizes it. However, in a case where only the second digit memory cell $C_1$ is the on-cell, even in this case, the current flowing through the memory cell is the same as the individual current i, but when the individual current i is transferred to the digital calculation unit, the digital calculation unit recognizes the output signal as $2^1 \times i$ and digitizes it. This is also the case when the third memory cell $C_3$ is the on-cell, and when the third memory cell is on-cell, the digital calculation unit recognizes the output signal appearing through the flowing current as $2^2 \times i$ and digitizes it.

In this way, it is possible to express the weights of the synaptic unit 320 in stages, and finally, as in FIG. 7, the synaptic unit 320 can express $2^N$ weights even with N cells.

In contrast, even if the synaptic unit has a plurality of memory cells, if each memory cell does not have a number of digits, $2^N$ memory cells are required in order for one synaptic unit to express $2^N$ weights.

An example in which the VMM is calculated when there are a plurality of synaptic units in the neuromorphic system according to the invention will be described in more detail with reference to FIG. 8.

FIG. 8 illustrates a case in which signals of 1, 3, and 6 are input as input signals and the weights of the synapses are 2, 5, and 1. The VMM is calculated through the product of the input signals and the weights of the synaptic unit. When this is calculated, the final signal of 23 should be calculated.

FIG. 8 illustrates that three synaptic units $W_{11}$, $W_{21}$, $W_{31}$ each having four memory cells are arranged in a memory array having a cross-point structure. Here, the output electrode line has the number of digitized digits, and according to the binary numeral system, $L_0$ has the number of digits of $2^0$, $L_1$ has the number of digits of $2^1$, $L_2$ has the number of digits of $2^2$, and $L_3$ has the number of digits of $2^3$.

A case where, in the synaptic unit $W_{11}$, a memory cell $C_{13}$ arranged on the output electrode line having the number of digits of $2^1$ is in the on-cell state, in the synaptic unit $W_{21}$, memory cells $C_{22}$ and $C_{24}$ arranged on the output electrode line having the number of digits of $2^0$ and the output electrode line having the number of digits of $2^2$ are in the on-cell state, and in the synaptic unit $W_{31}$, a memory cell $C_{34}$ arranged on the output electrode line having the number of digits of $2^0$ is in the on-cell state, is illustrated. In the case of the on-cell, the conductivity of each memory cell is the same, and in the case of an off-cell, no current passes.

Here, it indicates that the input signals $X_1$, $X_2$, and $X_3$ come in magnitudes of 1, 3, and 6. FIG. 8 illustrates a case in which the magnitude of each of the input signals is expressed by the number of pulses having the same height and width. However, various input signals may be expressed not only by the number of pulses, but also by a difference in pulse width or a difference in pulse height.

An input signal $X_1$ is applied to the synaptic unit $W_{11}$ so that a current $X_1*C_{13}$ flows from the on-cell $C_{13}$ through the output electrode line $L_1$. Here, since the memory cells each of which is in on-cell state have the same level of conductivity, if the output signal has a plurality of pulses, the same current flows for one of them. Therefore, if a current flowing through the memory cell when one pulse is applied to the memory cell, which is the on-cell, is i, the current $X_1*C_{13}$ flowing from the memory cell $C_{13}$ has a magnitude of $1*i$.

Similarly, when an input signal $X_2$ having three pulses is applied to the synaptic unit $W_{21}$, a current having the magnitude of $3*i$ flows through the output electrode line $L_2$ and a current having the magnitude of $3*i$ flows through the output electrode line $L_0$. Finally, when an input signal $X_3$ having six pulses is applied to the synaptic unit $W_{31}$, a current having the magnitude of $6*i$ flows through the output electrode line $L_0$.

In this way, the current flowing through each synaptic unit by the input signal is summed for each output electrode line, which can be expressed as follows.

$$X_2*C_{24}+X_3*C_{34}=3*I+6*i=9*i \qquad L_0$$

$$X_1*C_{13}=1*i \qquad L_1$$

$$X_2*C_{22}=3*i \qquad L_2$$

As described above, the current flowing for each output electrode line is transmitted as an output signal to the digital calculation section, and the digital calculation section evaluates and calculates the output signal according to the number of digits designated for each output electrode line. The current flowing through the output electrode line $L_0$ is multiplied by $2^0$, the current flowing through the output electrode line $L_1$ is multiplied by $2^1$, and the current flowing through the output electrode line $L_2$ is multiplied by $2^2$ to sum these digitized signals. Accordingly, the sum of all digitized output signals becomes $(9*2^0+1*2^1+3*2^2)=23$.

As such, in the neuromorphic system according to the invention, the output signal expressed in the analog form through the sum of currents for each output electrode line of the synapse section is digitized according to the number of digitized digits for each line. Through such an analog-digital hybrid computing system, it is possible to represent a linear and predictable change in synaptic weight while utilizing a small number of memory cells.

Meanwhile, in an embodiment of the invention, the non-volatile memory cell may be a multi-bit memory cell capable of storing information of two or more bits. In this specification, the multi-bit memory cell refers to a cell capable of storing information of two or more bits through a plurality of resistance states. Accordingly, the multi-bit memory cell generally includes a 3-bit TLC, a 4-bit QLC, etc. as well as an MLC capable of storing 2-bit information in a flash memory. In addition, the multi-bit memory cell is also meant to include the resistive random access memory (RRAM), phase change random access memory (PRAM), magnetic random access memory (MRAM), and ferroelectric random access memory (FeRAM) that can store information of two or more bits through multiple resistance states.

The number of memory cells used can be reduced by using such multi-bit memory cells and thus, the size of the memory array is reduced, thereby reducing an area of the entire system and an amount of power consumed during operation.

FIG. 9 illustrates an embodiment in the case of one-level cell (SLC) capable of storing 1-bit information when the non-volatile memory cell is a flash memory and FIG. 10 illustrates an embodiment in the case of a multi-level cell (MLC) capable of storing 2-bit information when the non-volatile memory cell is a flash memory.

In FIG. 9, as described in FIG. 8, the input signals $X_1$, $X_2$, and $X_3$ are applied to the synaptic units $W_{11}$, $W_{21}$, and $W_{31}$, respectively, and a current flows from the on-cells through the output electrode line. Here, since the memory cells each of which is in the on-cell state have the same level of conductivity, if the output signal has a plurality of pulses, the same current flows for one of them. Therefore, when one pulse is applied to the memory cell which is an on-cell, if the current flowing through the memory cell is i, the magnitude of the current flowing from one memory cell due to the single input pulse becomes $1*i$.

Through this, an output signal is generated for each output electrode line with respect to the input signal in the same manner as in FIG. 8, and a digital signal is output according to the number of digits designated for each output electrode line. The digital signal value calculated through this becomes 89.

In comparison to this, each memory cell in FIG. 10 can represent three levels of resistance states $R_1$, $R_2$, and $R_3$. Due to this, the currents $i_1$, $i_2$, and $i_3$ flowing through the memory cells in respective resistance states $R_1$, $R_2$, and $R_3$ with respect to one pulse of the input signals $X_1$, $X_2$, and $X_3$ are different. As three different resistance states can be represented in this way, the number of digits of each output electrode line can represent a position according to the quaternary numeral system. According to the quaternary numeral system, $L_0$ indicates the number of digits of $4^0$, $L_1$ indicates the number of digits of $4^1$, $L_2$ indicates the number of digits of $4^2$, and $L_3$ indicates the number of digits of $4^3$.

In FIG. 10, the synaptic unit $W_{11}$ is in a case where a memory cell $C_{14}$ arranged on the output electrode line having the number of digits of $4^0$ is in an on-cell state and has a resistance state of $R_2$, the synaptic unit $W_{21}$ is in a case where memory cells $C_{23}$ and $C_{24}$ arranged in the output electrode line having the number of digits of $4^1$ and the output electrode line having the number of digits of $4^0$ are in the on-cell state and have resistance states of $R_1$ and $R_3$, respectively, and the synaptic unit $W_{31}$ is in a case where memory cells $C_{33}$ and $C_{34}$ arranged in the output electrode line having the number of digits of $4^1$ and the output electrode line having the number of digits of $4^0$ are in the on-cell state and have resistance states of $R_2$ and $R_3$, respectively.

Here, as in FIG. 9, when the input signals $X_1$, $X_2$, and $X_3$ are expressed as the number of pulses having the same height and width and are input with magnitudes of 1, 3, and 6, a current flows from the on-cell having various resistances in each output electrode line.

First, when the input signal $X_1$ having one pulse is applied to the synaptic unit $W_{11}$, a current $1*i_2$ flows from the memory cell $C_{14}$ having a resistance state of $R_2$. Further, when the input signal $x_2$ having three pulses is applied to the synaptic unit $W_{21}$, a current $3*i_1$ flows from the memory cell $C_{23}$ having a resistance state of $R_1$ and a current $3*i_3$ flows from the memory cell $C_{24}$ having a resistance state of $R_3$. Further, when the input signal $X_3$ having six pulses is applied to the synaptic unit $W_{31}$, a current $6*i_2$ flows from the memory cell $C_{33}$ having the resistance state of $R_2$ and a current $6*i_3$ flows from the memory cell $C_{34}$ having the resistance state of $R_3$.

Accordingly, a current $(3*i_1+6*i_2)$ flows from the output electrode line $L_1$ and a current $(1*i_2+9*i_3)$ flows from the output electrode line $L_0$. When these currents are converted into digital signals, the calculation is performed by recognizing a digital signal $i_1$ as 1, $i_2$ as 2, $i_3$ as 3, the output electrode line $L_1$ as $4^1$, and the output electrode line $L_0$ as $4^0$.

The digital signal calculated in this way outputs a value of 89 as in FIG. 9. In FIG. 9, the calculation is performed using seven memory cells in four output electrode lines $L_0$, $L_1$, $L_2$, and $L_3$, whereas in FIG. 10, the calculation may be performed using four memory cells in two output electrode lines $L_0$ and $L_1$.

By using the multi-bit memory cells in this way, the area of the memory array and thus the area of the entire neuromorphic system can be reduced, and power consumption can also be reduced.

The reduction in the area of the memory array as a result of using multi-bit memory cells will be further described with reference to FIG. 11 in relation to setting one synaptic weight. If a synapse Ws has a synaptic weight of 137 and the memory cells of the synapse are single-level cells (SLCs) each of which can store 1-bit information, a value of 10001001 is represented through 8 output electrode lines $2^0$ to $2^7$ according to the binary numeral system (FIG. 11(a)). In comparison to this, if the same synaptic weight is represented through a synapse Wm composed of MLCs each of which can represent 2-bit information, the synaptic weight can be represented through a value of 2021 through four output electrode lines $4^0$ to $4^3$ according to the quaternary numeral system. (FIG. 11(b)). Furthermore, in order to represent the same synaptic weight 137 in a synapse Wt composed of TLCs each of which can represent 3-bit information, the synaptic weight can be expressed as a value of 211 through three output electrode lines $8^0$ to $8^2$ (FIG. 11(c)).

Meanwhile, in the invention, the controller section may set a bit level of the multi-bit memory cell for each output electrode line. For example, the TLC capable of storing 3-bit information can be used for the output electrode line representing the lower number of digits, and the SLC capable of storing 1-bit information or the MLC capable of storing 2-bit information can be used for the output electrode line representing the higher number of digits. Such bit level setting is determined by the controller section when storing the logic state.

In this method, if an error occurs at the higher number of digits, the VMM operation is greatly affected, and thus a memory cell that stores low information, such as 1 bit or 2 bits, but have high accuracy is used at the higher number of digits and the multi-bit memory cell capable of storing more information such as 3 bits or 4 bits is used at the lower number of digits, thereby capable of reducing the area of the entire memory array.

Therefore, it is preferable that the bit level is determined for each output electrode line by the controller becomes the same or lower as the number of digits increases depending on the output electrode line.

An embodiment in which the weights of the synapse in which bits of different levels are set for each output electrode line are determined will be described with reference to FIG. 12. In FIG. 12(a), if the memory cells arranged on a first and second output electrode lines $L_{10}$ and $L_{11}$ of a synapse $Wh_1$ are set to store 3-bit information and the number of digits of $8^0$ and $8^1$ are designated, respectively, and the memory cell arranged on a third output electrode line $L_{12}$ of the synapse $Wh_1$ is set to store 2-bit information and the number of digits of $4^3$ is designated, it is possible to express the weight of 137 through 211, which is a combination of these.

Also, as illustrated in FIG. 12(b), if the memory cells arranged on a first and second output electrode lines $L_{20}$ and $L_{21}$ of a synapse $Wh_2$ are set to store 3-bit information and the number of digits of $8^0$ and $8^1$ are designated, respectively, and the memory cells arranged on a third and fourth output electrode lines $L_{22}$ and $L_{23}$ of the synapse $Wh_2$ are set to store 1-bit information and the number of digits of $2^6$ and $2^7$ are designated, respectively, it is possible to express the weight of 137 through 1011, which is a combination of these as well.

In FIG. 12(c), if the memory cells arranged on a first, second, and third output electrode lines $L_{30}$, $L_{31}$, and $L_{32}$ of a synapse $Wh_3$ are set to store 2-bit information and the number of digits of $4^0$, $4^1$, and $4^2$ are designated, respectively, and the memory cells arranged on a fourth and fifth output electrode lines $L_{33}$ and $L_{34}$ of the synapse $Wh_3$ are set to store 1-bit information and the number of digits of of $2^6$ and $2^7$ are designated, respectively, it is possible to express the weight of 137 through 10021, which is a combination of these.

In this way, even if a multi-bit memory cell is used, the effect of an error in output is not significant at the lower number of digits, and thus a high bit level multi-bit memory cell is used at the lower number of digits, and a low bit level multi-bit memory cell with high accuracy is used at the higher number of digits, thereby capable of effectively reducing the area of the entire neuromorphic system while maintaining computational accuracy.

Further, in an embodiment of the invention, a positive output electrode line and a negative output electrode line may be designated in a pair for each of the number of digitized digits.

When the synaptic weight can express not only a positive integer but also a negative integer, the accuracy can be increased in the learning and inference process. To this end, if two output electrode lines of the same number of digits are paired with each other, one output electrode line represents a positive value, and the other output electrode line represents a negative value, a negative synaptic weight can be expressed.

This is illustrated in FIG. 13. Although there are two output electrode lines indicating $2^1$, one of them indicates a positive value and the other indicates a negative value. Therefore, in order to express a negative value of –2, a cell $-C_{13}$ of an output electrode line indicating a negative value among the output electrode lines indicating the digit of $2^1$ in the synapse $W_{11}$ is put into an on-cell state to express the negative value of –2.

In the process of converting the current flowing through each output electrode line into a digital signal, the current of the negative output electrode line is converted to a negative value and the sum of these converted signals is calculated. Therefore, in FIG. 13, the current flowing in the $-L_1$ line flows with a magnitude of $1*i$, but is calculated as $-1*2^1$ when converted into a secondary output signal. On the other hand, a current of $6*i$ flows in the $+L_1$ line, which has the same number of digits but represents a positive value, and this current is calculated as $6*2^1$ when converted into the secondary output signal. If the currents flowing for each line is summed, it is calculated that a current of $5*i$ flows, and when this is converted into a final digital signal, a digital signal of $5*2^1$ can be calculated at the output electrode line having the number of digits of $2^1$. Finally, when the signals for each line are summed, a value of 31 is output.

There is an advantage in that an error of actual calculation due to a parasitic current may be reduced through this method. In the entire memory array, the parasitic currents flow finely even through the off-cells. When the accumulated parasitic current increases, there is a problem in that an error may occur in evaluating the number of on-cells. The embodiment in FIG. 13 is a method that can efficiently control the parasitic currents that flow finely even through the off-cells. For the parasitic currents flowing through the off-cells, when the current flowing in the positive output electrode line and the current flowing in the negative output electrode line are recognized as positive and negative, respectively, and summed, the currents cancel each other to reduce the magnitude thereof.

For example, only the off-cells are arranged in $+L_3$ and $-L_3$, which are the output electrode lines in FIG. 13, but the parasitic currents flow finely even to these off-cells. However, if the current flowing in $+L_3$ is made to be positive and the current flowing in $-L_3$ is made to be negative and the sum of them is calculated, theoretically 0 is calculated and the possibility of error is eliminated.

Meanwhile, in addition to determining the number of digitized digits only in the synaptic unit, the VMM can be performed more efficiently by setting the number of digits in the output signal as well.

To this end, in one embodiment of the neuromorphic system provided by the invention, the input signal generated from the input signal section may be caused to be one or more pulses having the same width and height, the one or more pulses may be caused to be sequentially applied to the synapse section according to the order of generation and the numbers of digitized digits different from each other may be caused to be designated to the one or more pulses according to the order of generation, the output signal may be caused to be sequentially generated for each of the pulses sequentially applied, and the digital calculation section may be caused to digitize the output signal generated for each output electrode line for each of the pulses according to the number of digits according to the order of generation of the pulse and the number of digits of the output electrode line, and to calculate the sum of the digitized output signals.

The plurality of memory cells arranged in the synaptic unit has a number of digitized digits for each output electrode line arranged as in the example described above, and in addition, the input signal is one or more pulses having the same width and height, such that the input signal has a number of digitized digits according to the order of generation of the pulses, and thus the digital calculation section digitizes the output signal through a combination of these and calculates the sum of the output signals to perform the VMM.

This will be described in more detail in FIG. 14. It is indicated that three synaptic units $W_{11}$, $W_{21}$, and $W_{31}$ each having four memory cells are arranged in the memory array, as in FIG. 8. Here, the output electrode line $L_0$ has the number of digits of $2^0$, the output electrode line $L_1$ has the number of digits of $2^1$, the output electrode line $L_2$ has the number of digits of $2^2$, and the output electrode line $L_3$ has the number of digits of $2^3$. The arranged on-cells and off-cells of the memory cells are also the same as in the case of FIG. 8.

The input signal input to the memory cell has the number of digitized digits in pulse different from each other according to the order of generation of the pulse. A first generated pulse $P_0$ has the number of digits of $2^0$, a second pulse $P_1$ has the number of digits of $2^1$, a third pulse $P_2$ has the number of digits of $2^2$, and a fourth pulse $P_3$ has the number of digits of $2^3$, respectively. Accordingly, if the input signals 1, 3, and 6 are input as in the case of FIG. 8, the input signal $X_1$ expresses 0001 according to the binary number system only with a first pulse so that 1 is input, the input signal $X_2$ expresses 0011 according to the binary numeral system by generating a first pulse and a second pulse so that 3 is input, and the input signal $X_3$ expresses 0110 according to the binary numeral system by generating a second pulse and a third pulse so that 6 is input.

Accordingly, the output signal is digitized according to the input signal applied according to the order of generation of the pulse and the output electrode line from which the output signal is generated, and the sum of these digitized output signals is calculated.

If a value of the current applied to the memory cell by one pulse is $\chi$ and the current flowing when one pulse is applied to the on-cell is i, first, by the first pulse ($P_0$), a current of $1*i$ flows from the memory cell $C_{24}$ by the input signal $X_2$ for the output electrode line $L_0$, a current of $1*i$ flows from the memory cell $C_{13}$ by the input signal $X_1$ for the output electrode line $L_1$, and a current of $1*i$ flows from the memory cell $C_{22}$ by the input signal $X_2$ for the output electrode line $L_2$.

The output signal generated for each pulse generation order and each output electrode line is illustrated in FIG. 14. In the output electrode line $L_0$, a current of $1*i$ is generated as an output signal by the first pulse $P_0$, a current of $2*i$ is generated as an output signal by the second pulse $P_1$, and a current of $1*i$ flows by the third pulse $P_2$, and these currents are generated as an output signal. When these output signals are transmitted to the digital calculation section, the digital calculation section recognizes the number of digits of $2^0$ for the output signal of the first pulse, the number of digits of $2^1$ for the output signal of the second pulse, and the number of digits of $2^2$ for the output signal of the third pulse, and calculates by assigning the number of digits of $2^0$ to $L_0$, which is the output electrode line. Calculating in this way, the output signal from the output electrode line $L_0$ is an output signal digitized according to respective pulses, and has a value of 9 (4+4+1=9).

When the output signals from the remaining output electrode lines are converted into the digitized output signal in this way, a digitized output signal of 2 is calculated for the output electrode line $L_1$ and a digitized output signal of 12 is calculated for the output electrode line $L_2$. The sum of these digitized output signals for each output electrode line becomes 23 as in FIG. 8.

By designating the number of digitized digits according to the pulse generation order, it is possible to express input signals of various magnitudes through the limited number of pulses, width of the pulse, height of the pulse, or a combination thereof. As a result, energy consumption for generating an input signal in the neuromorphic system can be greatly reduced through this.

The memory cell in the invention is a non-volatile memory cell and is capable of storing a logic state. The non-volatile memory cell may include a non-volatile memory element and a selection element, and the non-volatile memory element may be any one of the flash memory element, the resistive random access memory (RRAM) element, the phase change random access memory (PRAM) element, the magnetic random access memory (MRAM) element, the ferroelectric random access memory (FeRAM) element, and the selective-memory element.

Meanwhile, the selection element may be a transistor or a diode. In the case of a selected cell to which the transistor or diode is connected, when an input signal is applied, a current can flow through the memory cell according to a resistance state of the non-volatile memory element, and in the case of an unselected cell, the flow of current can be blocked. Through this, it is possible to prevent unnecessary current flow by allowing the current to flow only through the selected, that is, the memory cell corresponding to the synaptic element to be calculated through the VMM. In contrast, if a two-terminal element or the like is used as the selection element, there is an advantage that the apparatus can be miniaturized compared to the case where the transistor or the like is used. However, even a small amount of current cannot be prevented from flowing to a memory cell that is not required for calculation even if it is in a memory array, and thus power consumption appears.

On the other hand, when the transistor or diode is connected as the selection element, the current flowing from the selected memory cell of the synaptic unit by the input signal may be controlled to a predetermined current magnitude while allowing the input signal to flow only to the selected memory cell required for calculation in the memory array. When the non-volatile memory element of the selected cell is in an on-cell state, the resistance of each memory element may have a certain partial deviation, and an error due to the deviation is unavoidable. By controlling the current flowing from the memory element by the input signal to a predetermined magnitude in order to minimize the deviation, it is possible to minimize an error range of the output signal due to the deviation between the memory elements. In particular, when the number of digital digits of the memory cell is large, for example, when it is $2^7$, even a minute error is amplified to $2^7$, and thus it is very important that the current flowing in the on-cell is accurately controlled to a constant level.

Further, in the case of the on-cell, since the current flowing appears to be very large, it is possible to reduce power consumption by limiting it to a certain range or less.

This is illustrated in FIG. 15. When an input voltage $V_1$ is applied to the memory cell in a state where there is no transistor as the selection element, the current passing through the memory cell becomes $I_{on}$ or $I_{off}$ according to the on-cell or off-cell state, respectively. In particular, $I_{on}$, which is a current in the on-cell state, has a very large magnitude and has an error depending on the memory cell. This error needs to be kept constant because it may cause a large error to appear in the case of the memory cell arranged in an electrode line having the large number of digits.

To this end, if the transistor is included as the selection element to limit the current to a certain range, no current flows in the unselected cell in the memory array, and even in the selected cell, a current of magnitude $I_{off}$ still flows in the memory cell in the off-cell state, but it is possible to limit the current in the on-cell state to the $I_{TR}$ as illustrated in FIG. 15.

If the transistor is used as the selection element in this way, there is an advantage that the current can flow only through the selected synaptic element required for calculation and power consumption can be greatly reduced by limiting the magnitude of the on-cell current, and the error factor can be minimized by controlling the current flowing through the on-cell to a certain level.

Further, the selection element may be a two-terminal switching element. By applying the two-terminal switching element as the selection element for selecting the memory cell in this way, it is possible to increase the degree of integration and reduce power consumption. The two-terminal switching element may be an element such as an ovonic threshold switch, a transition metal oxide switch, a mixed ion-electron conductor (MIEC) switch, a complementary resistive switch, doped amorphous silicon, or the like. Such a two-terminal switching element has a characteristic of exhibiting a large resistance change based on a fixed voltage, that is, a threshold voltage, and through this, it is possible to select a cell in the memory array.

Further, in the invention, the plurality of memory cells of the synaptic unit may include a selective-memory element capable of simultaneously storing a logical state and performing a function of selecting a cell.

The selective-memory element refers to an element having non-volatile memory characteristics and selection element characteristics at the same time. The selective-memory element refers to an element that a logic state can be stored by a change in resistance and, at the same time, can operate as a selection element by causing a change in resistance based on a fixed voltage, that is, a threshold voltage.

For example, in the case of an ovonic threshold switch made of a chalcogenide material, different resistance states can be created by applying a writing voltage with different polarities, and a logic state using this can be stored and read. Therefore, even a chalcogenide material without a phase change may also be a variable resistance element, and at the same time, may have a characteristic that a constant change in resistance occurs before and after a threshold voltage based on a unique switch characteristic, that is, the threshold voltage.

As such, when utilizing the variable resistance element containing the chalcogenide material without a phase change like the conventional ovonic threshold switch element, it is possible to select one or more memory cells through the switch characteristic and store a logic state in each of the more memory cells through a variable resistance characteristic.

Such an element can be represented as a selective-memory element. In this case, since an additional memory element or a selection element is not required, it is possible to increase the density of the memory device and reduce power consumption thereof. As the chalcogenide materials, In—Ge—As—Se alloy, Te—Se alloy, As—Se alloy, Ge—Te alloy, Ge—Se alloy, As—Se—Te alloy, Ge—As—Se alloy, Ge—As—Sb alloy, Ge—Sb—Te alloy, Ge—Sb—Se alloy, Ge—As—Te alloy, Si—Ge—As—Se alloy, Si—Te—As—Ge alloy, In—Sb—Te alloy, In—Sb—Se alloy, In—Ge—As alloy, In—Ge—Te alloy, In—Te alloy, etc. may be used. However, in addition to the material described above, it is not particularly limited as long as it is a material capable of storing a logic state by the change in resistance and simultaneously performing a switching function is not particularly limited.

Further, in the invention, when the non-volatile memory cell uses a two-terminal switching element as a selective-memory element capable of both storing a logic state and a cell selection function or as a selection element for a cell selection function, a voltage of the input signal may be in a range in which all of the plurality of non-volatile memory cells are not turned-on, and, at the same time, a range in which resistance states of the plurality of non-volatile memory cells can be distinguished.

The general cell selection process using a switching function in the memory array as in the invention is performed by allowing only a very low current to flow in the unselected cell using the characteristics of the switch element and applying a voltage capable of distinguishing the logic state of the cell to the selected cell.

A general method of reading the currents of the memory cells arranged in the memory array including the two-terminal switch element or the selective-memory element will be described with reference to FIG. 16. In order to know the logical state of the non-volatile memory cell arranged in the memory array, that is, whether it is the on-cell or off-cell, a reading voltage $V_{read1}$ is applied to the memory cell of which logic state is to be known. $V_{read1}$ is positioned between ($V_{th\_A} < V_{read1} < V_{th\_B}$) between a threshold voltage $V_{th\_A}$ at which an abrupt resistance change occurs in a cell having low resistance and a threshold voltage $V_{th\_B}$ at which the abrupt resistance change occurs in a cell having high resistance. That is, by allowing the cell having low resistance (on-cell) to be turned-on due to an occurrence of an abrupt change in resistance, and not allowing the abrupt change in resistance to occur in the cell having high resistance (off-cell), the logic state can be distinguished from the current flowing through the selected cell. In FIG. 16, as $V_{read1}$ is applied, the current of $I_{target,off}$ flows in the cell having high resistance and the current of $I_{target,on}$ flows in the cell having low resistance. In this method, only one cell may be selected from the memory array to read only the digital on and off states. The reason is that the current flow in the on state is so large that once a reading voltage is applied to one cell in the on state, the current flowing is so large that it is difficult to measure the current in other cells in the same memory array. For this reason, the general reading method may not be suitable to be applied to the operation of the neuromorphic system of the invention, in which it is required to simultaneous measure the currents of two or more selected memory cells constituting the memory array.

In operating the neuromorphic system of the invention, a method suitable for reading the current of the synaptic unit including the plurality of memory cells in a memory array having a cross-point structure and including the two-terminal switch element or the selective-memory element will be described with reference to FIG. 17.

The voltage of the input signal applied to the plurality of memory cells included in the synaptic unit, as indicated by '$V_{read2}$' in FIG. 17, is in a range between a subthreshold region voltage range (less than $V_{th1}$) in which all of the plurality of non-volatile memory cells included in the synaptic unit are not turned-on, and a range (exceeds $V_{sep}$) capable of distinguishing resistance states of the plurality of non-volatile memory cells. That is, in FIG. 17, $V_{read2}$, which is the reading voltage, is in a range which is greater than $V_{sep}$ and less than $V_{th1}$, which is the threshold voltage of the cell in the lowest resistance state among the selected cells, and in which, like $I_{target}$, a high-resistance state and a low-resistance state of the memory element can be distinguished. This range is indicated by $V_{input}$ in FIG. 17.

As such, when the voltage of the input signal is applied in the sub-threshold region, simultaneous reading of multiple cells is possible. This is because, unlike the general method described above, even when the input signal is applied to the on-cell, the current flowing through the on-cell is not large, and thus the sum of the currents flowing through the multiple non-volatile memory cells can be easily measured.

In the invention, the plurality of non-volatile memory cells of the synaptic unit may be arranged on different output electrode lines, so that each of the plurality of memory cells may have a different number of digits. Examples of this are illustrated in FIGS. 8 to 14.

In addition, in an embodiment of the invention, the plurality of non-volatile memory cells of the synaptic unit may be arranged in a plurality of memory arrays. Here, the memory array may refer to a memory array having a cross-point structure.

For example, as illustrated in FIG. 18, a plurality of memory cells of the synaptic unit $W_{11}$ may be arranged one by one in k memory arrays.

In the invention, the digital calculation section may include an analog-to-digital converter (ADC) connected to each of the output electrode lines. As described above, a current which is an analog signal, flows in each of the output electrode lines. In order to digitize this for each output electrode line and each pulse of the input signal, it is necessary to connect the analog-to-digital converter to an individual output electrode line.

In addition, the digital calculation section may include a current path shifter sequentially connected to each of the output electrode lines, a capacitor having the number of digitized digits, and the analog-to-digital converter. When the number of digital digits is designated according to the order of generation of the pulse, each of the output signals sequentially generated by each of the pulses sequentially applied to each output electrode line is stored in the capacitor having the number of digitized digits by the current path shifter in accordance with the number of digits according to the order of generation of the pulse. The sum of the output signals stored in the capacitors may be converted into a digital signal through the analog-to-digital converter.

When the number of digital digits is designated according to the order of generation of the pulse, as another example of the invention, the digital calculation section may include an analog-to-digital converter, digit shifter, and digital calculator sequentially connected to each of the output electrode lines.

Each of the analog output signals, which are sequentially generated for each output electrode line by each of the sequentially applied pulses, is converted into a first digital signal by the analog-to-digital converter, and the converted first digital signal is converted to a second digital signal by the digit shifter in accordance with the number of digits according to the order of generation of the pulse. The digital calculator calculates the sum of the converted second digital signals.

What is claimed is:

1. A neuromorphic system comprising:

an input signal section that generates an input signal;

a synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an analog output signal for each output electrode line by the input signal;

a digital calculation section that converts the analog output signal generated for each output electrode line into a digital output signal, and calculates a sum of the digital output signals; and a controller section that controls the input signal section, the synapse section, and the digital calculation section, wherein the controller section designates a number of digitized digits for each output electrode line and stores the logic state in the plurality of non-volatile memory cells according to a predetermined weight in each of the plurality of synaptic units, causes the input signal generated by the input signal section to be applied to each of a plurality of non-volatile memory cells of each of the plurality of synaptic units through each input electrode line, generates, as the analog output signal, a sum of currents, that flows from the plurality of non-volatile memory cells of each of the plurality of synaptic units by the applied input signal, for each output electrode line, and causes the digital calculation section to convert the analog output signal generated for each output electrode line into the digital output signal according to the number of digits and calculate the sum of the digital output signals.

2. The system according to claim 1, wherein the non-volatile memory cell includes a non-volatile memory element and a selection element, and the non-volatile memory element is any one of a flash memory element, a resistive random access memory (RRAM) element, a phase change random access memory (PRAM) element, a magnetic random access memory (MRAM) element, a ferroelectric random access memory (FeRAM) element, and a selective-memory element.

3. The system according to claim 2, wherein the selection element is a two-terminal element.

4. The system according to claim 2, wherein the selection element is a transistor or a diode.

5. The system according to claim 4, wherein the controller section unit control a current flowing from each selected memory cell of the synaptic unit by controlling the transistor or diode included in each of the plurality of non-volatile memory cells in the synaptic unit by the input signal to a predetermined current magnitude while allowing the input signal to flow only through the selected memory cell of the synaptic unit.

6. The system according to claim 1, wherein the non-volatile memory cell includes a multi-bit memory cell capable of storing information of two or more bits.

7. The system according to claim 6, wherein a bit level of the multi-bit memory cell is determined for each output electrode line by the controller section, and the determined bit levels are two or more different from each other.

8. The system according to claim 7, wherein the bit levels become equal or lower as the number of digits increases.

9. The system according to claim 1, wherein the non-volatile memory cell includes a selective-memory element and does not include a selection element.

10. The system according to claim 9, wherein a voltage of the input signal is in a range in which all of the plurality of non-volatile memory cells are not turned-on, and, at the same time, a range in which resistance states of the plurality of non-volatile memory cells can be distinguished.

11. The system according to claim 1, wherein the plurality of non-volatile memory cells of the synaptic unit are arranged on different output electrode lines, so that each of the plurality of memory cells has a different number of digits.

12. The system according to claim 1, wherein the plurality of non-volatile memory cells of the synaptic unit are arranged in two or more memory arrays.

13. The system according to claim 1, wherein the input signal is in the form of a pulse, and the input signal is expressed by a frequency, a number, a height, a width, or a combination thereof of the pulse.

14. The system according to claim 1, wherein the digital calculation section includes an analog-to-digital converter (ADC) connected to each of the output electrode lines.

15. The system according to claim 1, wherein a positive output electrode line and a negative output electrode line are designated in a pair for each of the number of digitized digits.

16. The system according to claim 1, wherein the controller section causes the input signal generated from the input signal section to be one or more pulses having the same width and height, causes the one or more pulses to be sequentially applied to the synapse section according to an order of generation and causes a number of digitized digits in pulse different from each other to be designated to the one or more pulses according to the order of generation, causes the analog output signal to be sequentially generated for each of the pulses sequentially applied, and causes the digital calculation section to convert the analog output signal generated for each output electrode line for each of the pulses into the digital output signal according to the number of digits in pulse according to the order of generation of the pulse and the number of digits of the output electrode line, and to calculate the sum of the digital output signals.

17. The system according to claim 16, wherein the digital calculation section includes an analog-to-digital converter, digit shifter, and digital calculator sequentially connected to each of the output electrode lines, each of the analog output signals, which are sequentially generated for each output electrode line by each of the sequentially applied pulses, is converted into a first digital signal by the analog-to-digital converter, and the converted first digital signal is converted to a second digital signal by the digit shifter in accordance with the number of digits in pulse according to the order of generation of the pulse, the digital calculator calculates a sum of the second digital signals generated for each output electrode line by the one or more pulses, and a value of the digital output signal is calculated.

18. The system according to claim 16, wherein the digital calculation section includes a current path shifter, a capacitor and an analog-to-digital converter sequentially connected to each of the output electrode lines, each of the analog output signals sequentially generated by each of the sequentially applied pulses for each output electrode line is stored in a capacitor by the current path shifter according to the number of digits in pulse according to the order of generation of the pulse and a sum of the analog output signals stored in the capacitor is converted into the digital output signal through the analog-to-digital converter, and a value of the digital output signal is calculated.

19. A method for operating a neuromorphic system, which includes an input signal section that generates an input signal, a synapse section that includes a plurality of synaptic units that receive the input signal and makes a current to flow according to a set weight, each of the plurality of synaptic units including a plurality of non-volatile memory cells capable of selectively storing a logical state, the non-volatile memory cells being arranged in a memory array that include input electrode lines and output electrode lines crossing each other, and generates an analog output signal for each output electrode line by the input signal, a digital calculation section that converts the analog output signal generated for each output electrode line into a digital output signal, and calculates a sum of the digital output signals, and a controller section that controls the input signal section, the synapse section, and the digital calculation section, the method comprising:

(a) a step of designating a number of digitized digits for each output electrode line and storing the logic state in the plurality of non-volatile memory cells according to a predetermined weight in each of the plurality of synaptic units;

(b) a step of generating an input signal by the input signal section and causing the input signal to be applied to each of a plurality of non-volatile memory cells of each of the plurality of synaptic units through the input electrode lines;

(c) a step of generating, as the analog output signal for each output electrode line, a sum of currents, that flows from the plurality of non-volatile memory cells by the applied input signal for each output electrode line;

(d) a step of converting the analog output signal into the digital output signal according to the number of digits for each output electrode line; and (e) a step of calculating the sum of the digital output signals.

20. The method according to claim 19, wherein, in said step (b), the input signal is one or more pulses which have the same width and height and to which the numbers of digitized digits in pulse different from each other are designated according to the order of generation such that the one or more pulses are sequentially applied to the plurality of non-volatile memory cells according to the order of generation, in said step (c), the analog output signal is sequentially generated for each of the pulses sequentially applied, and in said step (d), the analog output signal is converted into the digital output signal according to the number of digits in pulse according to the order of generation of the pulse and the number of digits of the output electrode line.

* * * * *